United States Patent
Sekine et al.

(10) Patent No.: US 12,230,623 B2
(45) Date of Patent: Feb. 18, 2025

(54) METHOD FOR MANUFACTURING SEMICONDUCTOR DEVICE AND SEMICONDUCTOR DEVICE

(71) Applicant: KIOXIA CORPORATION, Tokyo (JP)

(72) Inventors: Masaki Sekine, Mie (JP); Takanobu Ono, Mie (JP)

(73) Assignee: Kioxia Corporation, Tokyo (JP)

( * ) Notice: Subject to any disclaimer, the term of this patent is extended or adjusted under 35 U.S.C. 154(b) by 219 days.

(21) Appl. No.: 17/682,952

(22) Filed: Feb. 28, 2022

(65) Prior Publication Data

US 2022/0392883 A1   Dec. 8, 2022

(30) Foreign Application Priority Data

Jun. 4, 2021   (JP) ................................ 2021-094631

(51) Int. Cl.
*H01L 25/18* (2023.01)
*H01L 23/13* (2006.01)
(Continued)

(52) U.S. Cl.
CPC .............. *H01L 25/50* (2013.01); *H01L 23/13* (2013.01); *H01L 25/0657* (2013.01);
(Continued)

(58) Field of Classification Search
CPC ..... H01L 25/50; H01L 25/0657; H01L 25/18; H01L 23/13; H01L 23/147; H01L 23/15;
(Continued)

(56) References Cited

U.S. PATENT DOCUMENTS

| 7,960,820 B2 | 6/2011 | Shiraishi et al. |
| 10,886,255 B2 | 1/2021 | Hong et al. |

(Continued)

FOREIGN PATENT DOCUMENTS

| JP | 2007055010 A | 3/2007 |
| JP | 2009117611 A | 5/2009 |

(Continued)

OTHER PUBLICATIONS

Etsuji Ohmura et al., "Analysis of Internal Crack Propagation in Silicon Due to Permeable Pulse Laser Irradiation: Study on Processing Mechanism of Stealth Dicing", School of Engineering, Osaka University, Faculty of Engineering, Osaka University, Hamamatsu Photonics K.K., Journal of Materials Science and Engineering A 1 (2011) 46-52, David Publishing, Formerly part of Journal of Materials Science and Engineering, Jun. 10, 2011, 7 pages.

*Primary Examiner* — Timor Karimy
(74) *Attorney, Agent, or Firm* — Kim & Stewart LLP

(57) ABSTRACT

According to one embodiment, a method for manufacturing a semiconductor device includes forming a plurality of recess portions on a first surface of a support. Each recess portion is between protrusion portions on the first surface. A stacked body is then placed into each of the recess portions. The stacked body is a plurality of semiconductor chips stacked on each other or the like. The recess portions are filled with a resin layer. The resin layer covers the stacked bodies inside the recess portions. A protrusion portion of the support is irradiated with a laser beam to form a modified portion in the protrusion portion. The support is divided along the protrusion portions into separate pieces.

13 Claims, 35 Drawing Sheets

(51) Int. Cl.
  *H01L 23/14* (2006.01)
  *H01L 23/15* (2006.01)
  *H01L 25/00* (2006.01)
  *H01L 25/065* (2023.01)
  *H01L 23/00* (2006.01)

(52) U.S. Cl.
  CPC ............ *H01L 25/18* (2013.01); *H01L 23/147* (2013.01); *H01L 23/15* (2013.01); *H01L 24/32* (2013.01); *H01L 24/33* (2013.01); *H01L 24/73* (2013.01); *H01L 2224/32145* (2013.01); *H01L 2224/33181* (2013.01); *H01L 2224/73215* (2013.01); *H01L 2224/73265* (2013.01); *H01L 2225/0651* (2013.01); *H01L 2225/06548* (2013.01); *H01L 2225/06562* (2013.01); *H01L 2225/06586* (2013.01); *H01L 2924/15153* (2013.01); *H01L 2924/15738* (2013.01); *H01L 2924/15787* (2013.01); *H01L 2924/15788* (2013.01)

(58) Field of Classification Search
  CPC ......... H01L 24/32; H01L 24/23; H01L 24/73; H01L 2224/32145; H01L 2224/33181; H01L 2224/73215; H01L 2224/73265; H01L 2225/0651; H01L 2225/06548; H01L 2225/06562; H01L 2225/06586; H01L 2924/15153; H01L 2924/15738; H01L 2924/15787; H01L 2924/15788; H10B 80/00

See application file for complete search history.

(56) References Cited

U.S. PATENT DOCUMENTS

| | | |
|---|---|---|
| 2007/0298529 A1 | 12/2007 | Maeda |
| 2019/0378803 A1* | 12/2019 | Chang Chien .......... H01L 21/56 |
| 2020/0135698 A1* | 4/2020 | Hong .................. H01L 23/3142 |
| 2021/0091039 A1 | 3/2021 | Kinsley |

FOREIGN PATENT DOCUMENTS

| | | |
|---|---|---|
| JP | 2011056576 A | 3/2011 |
| TW | 200805718 A | 1/2008 |

\* cited by examiner

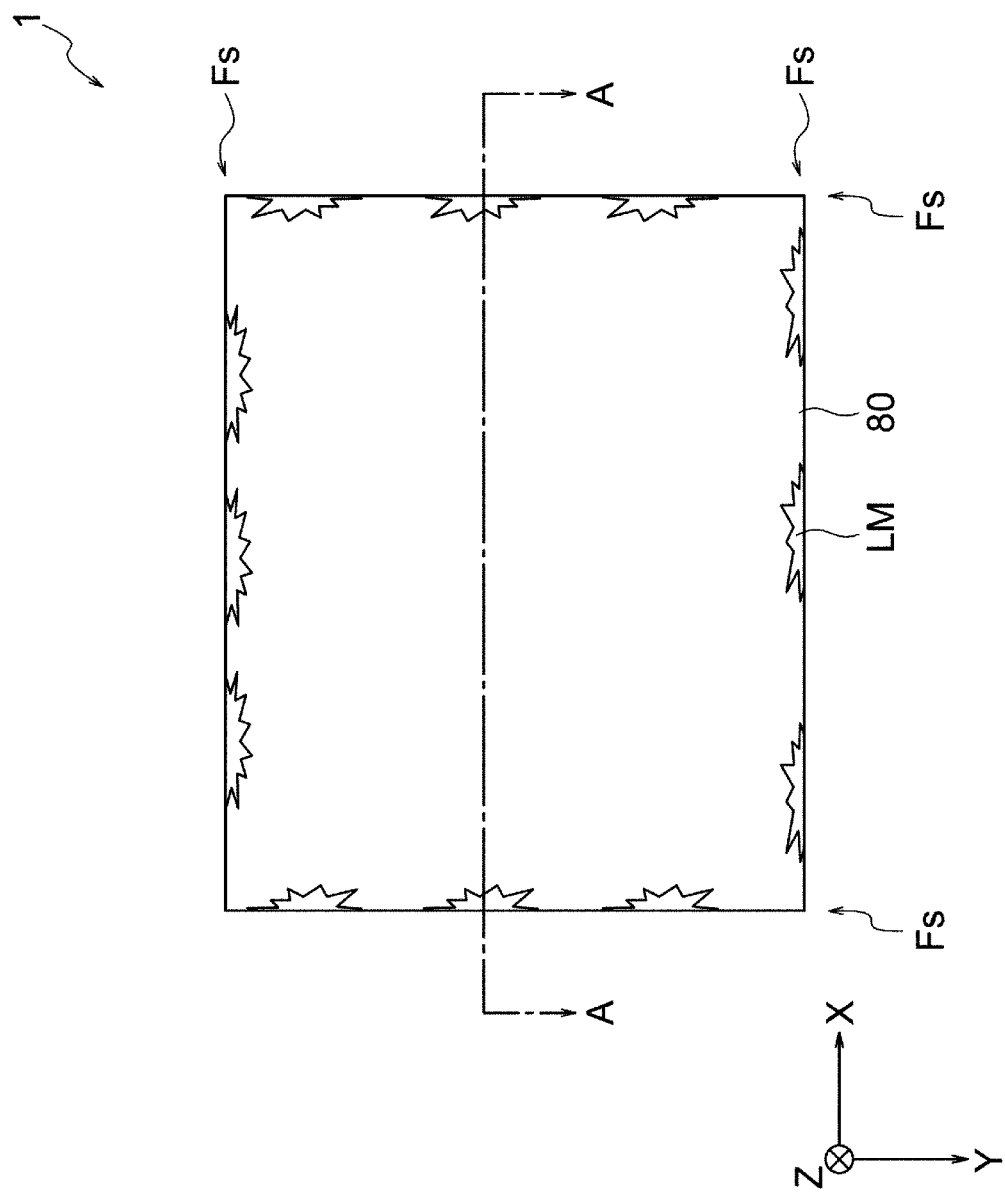

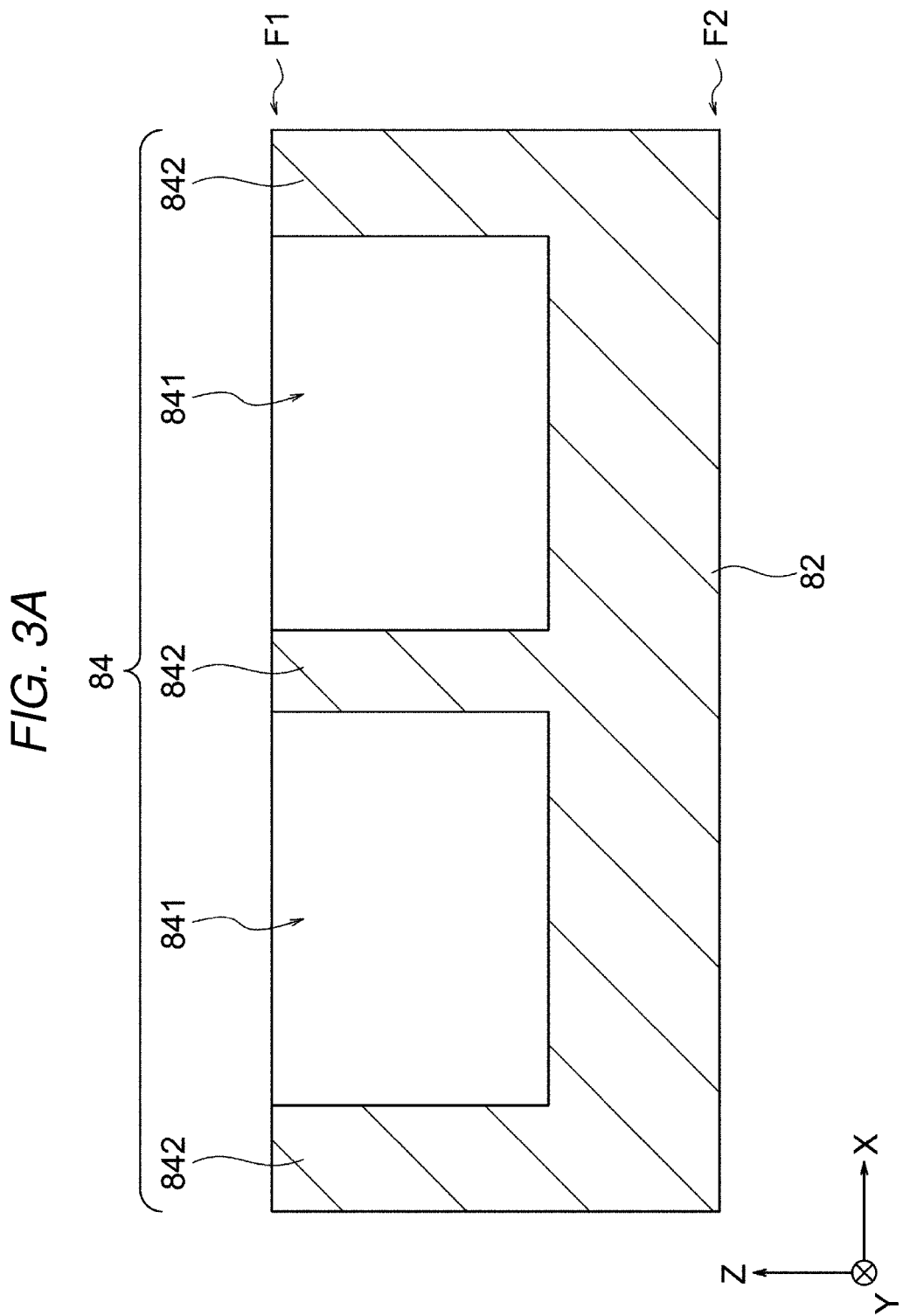

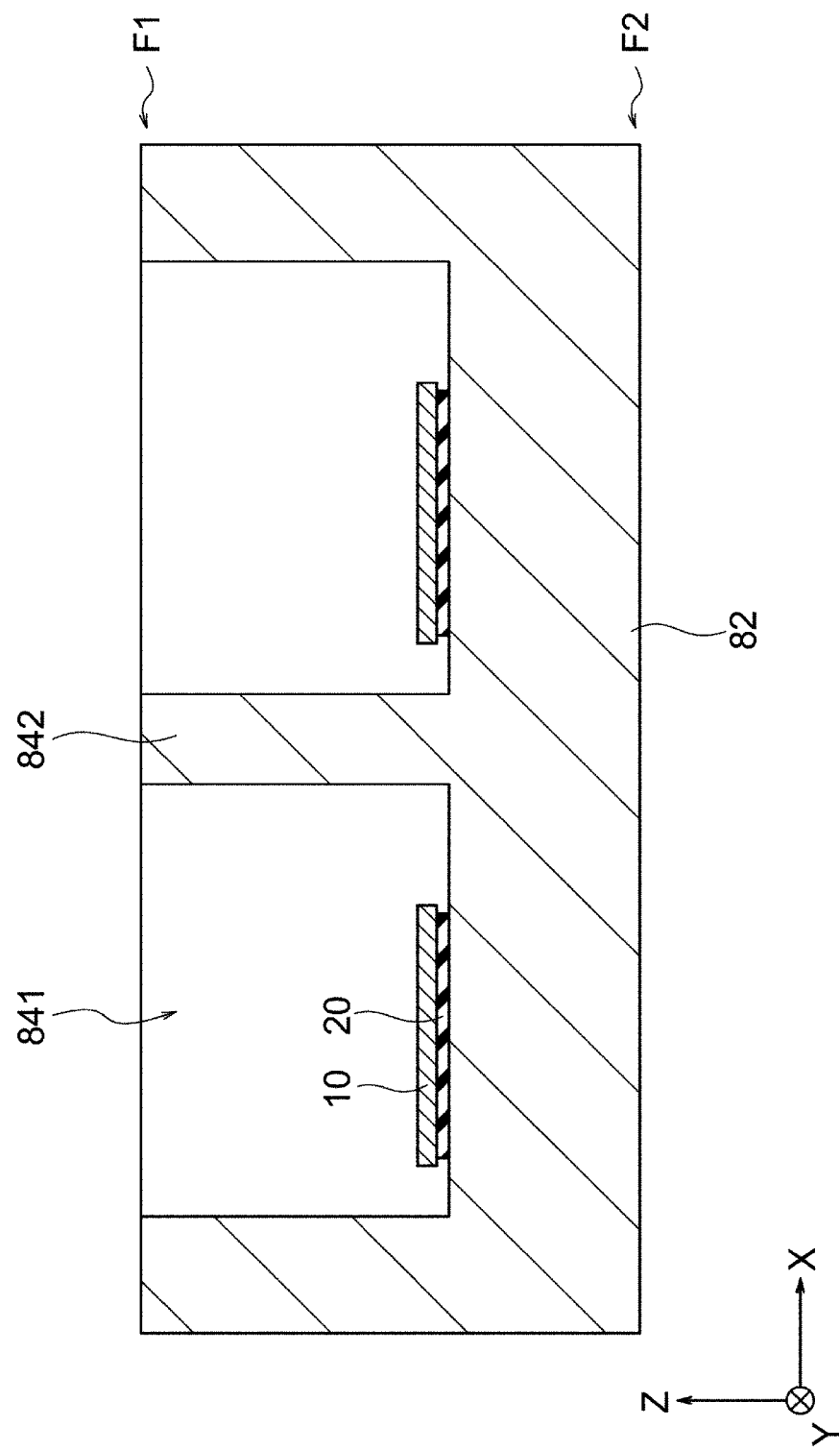

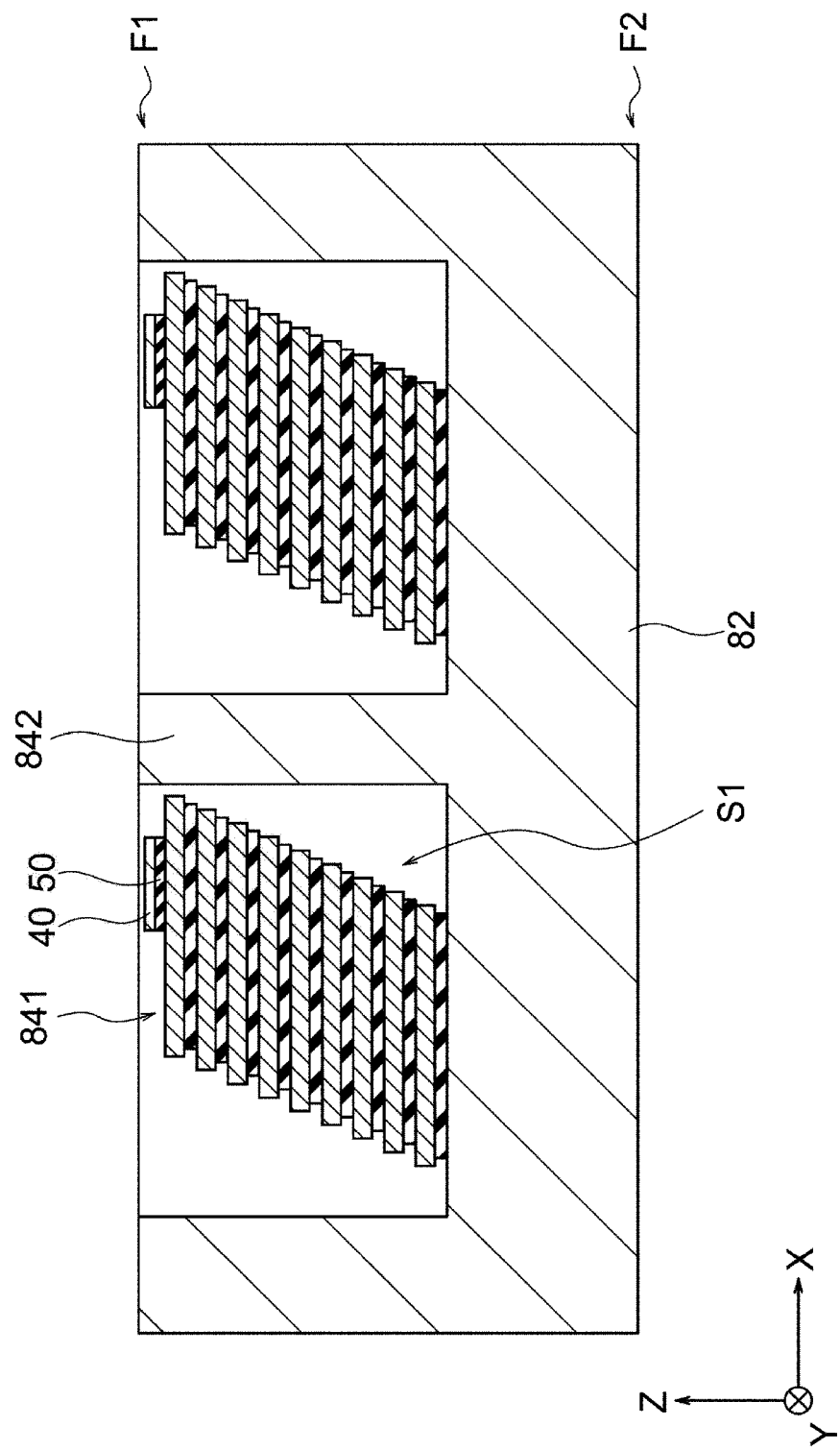

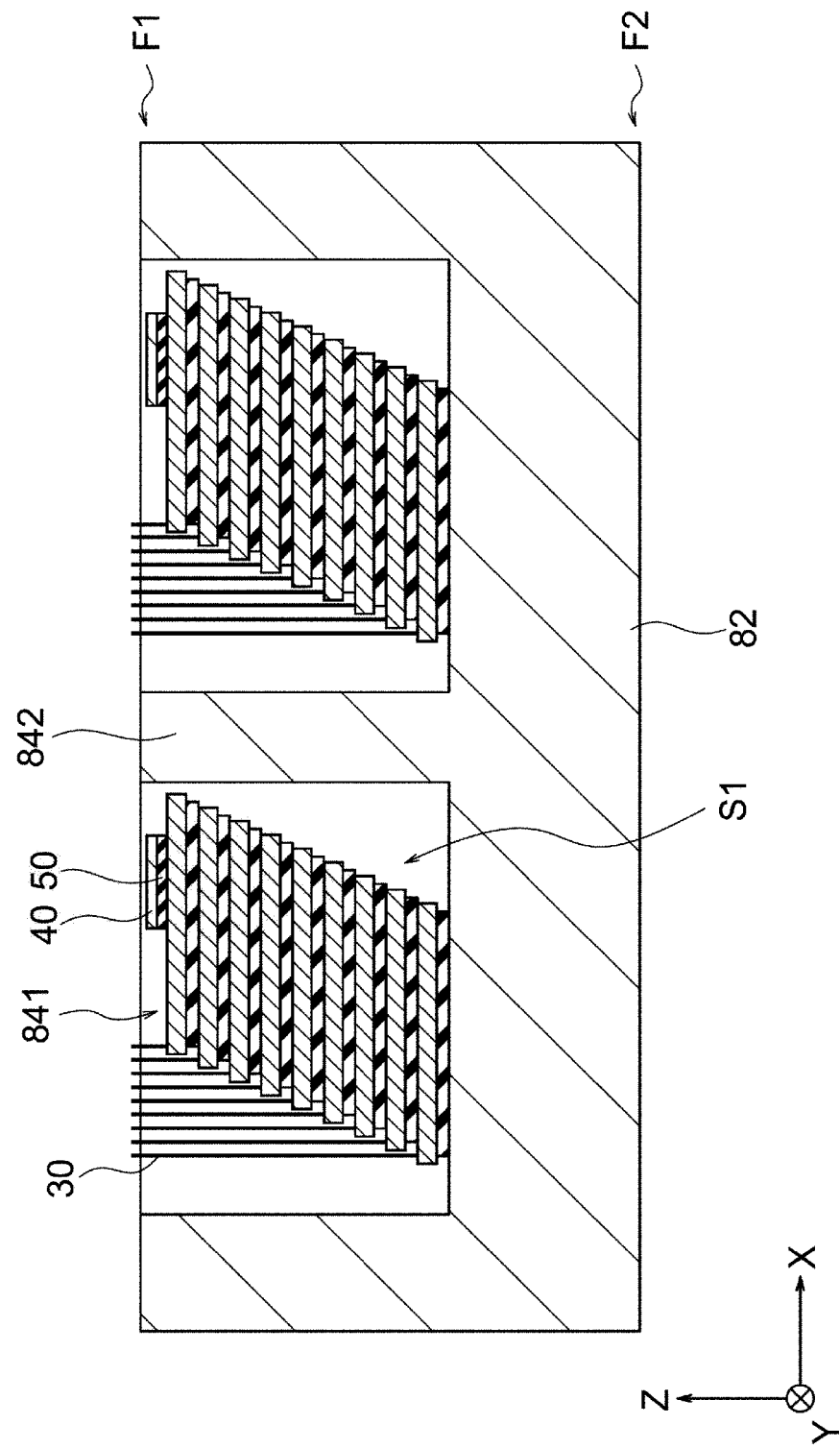

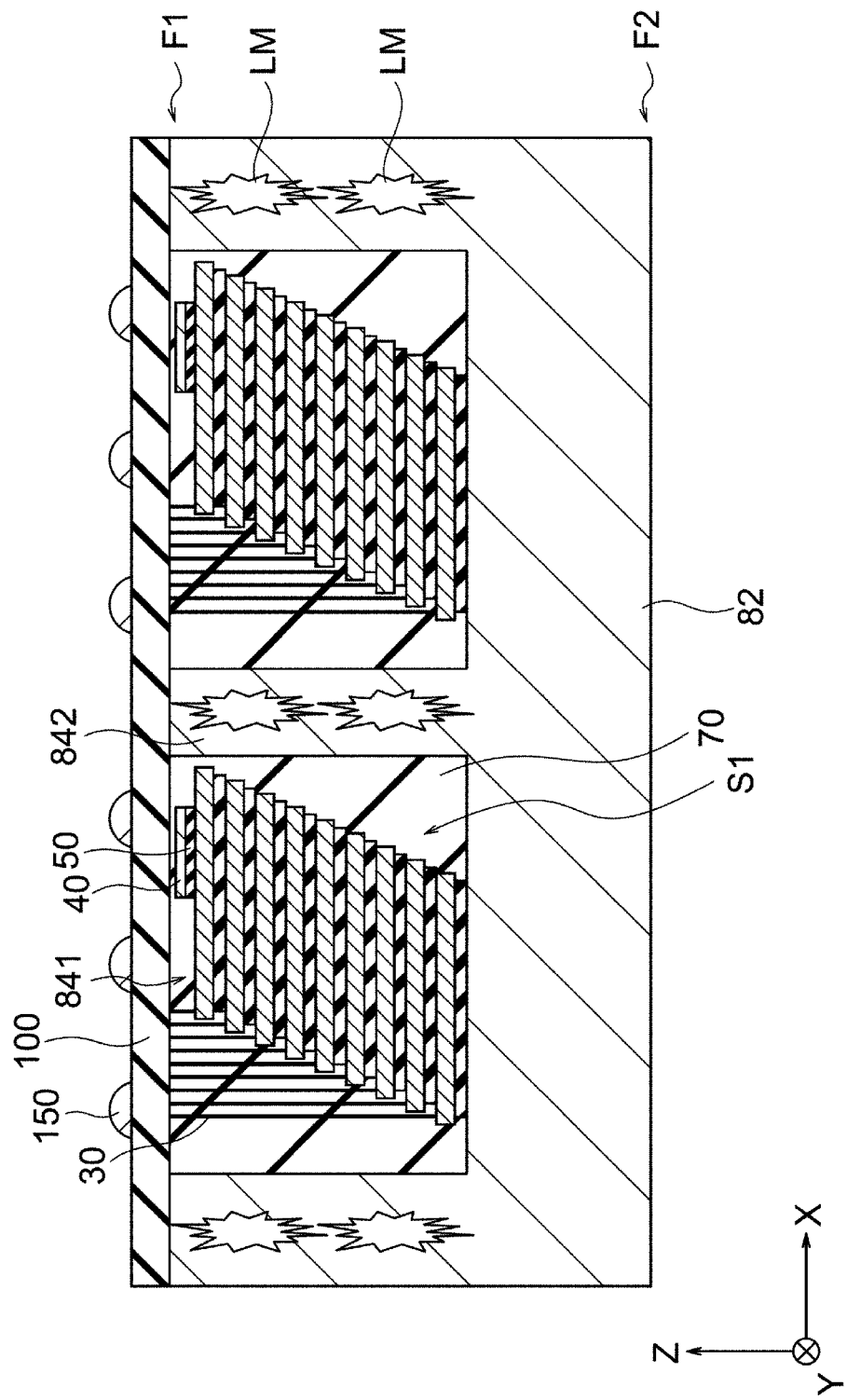

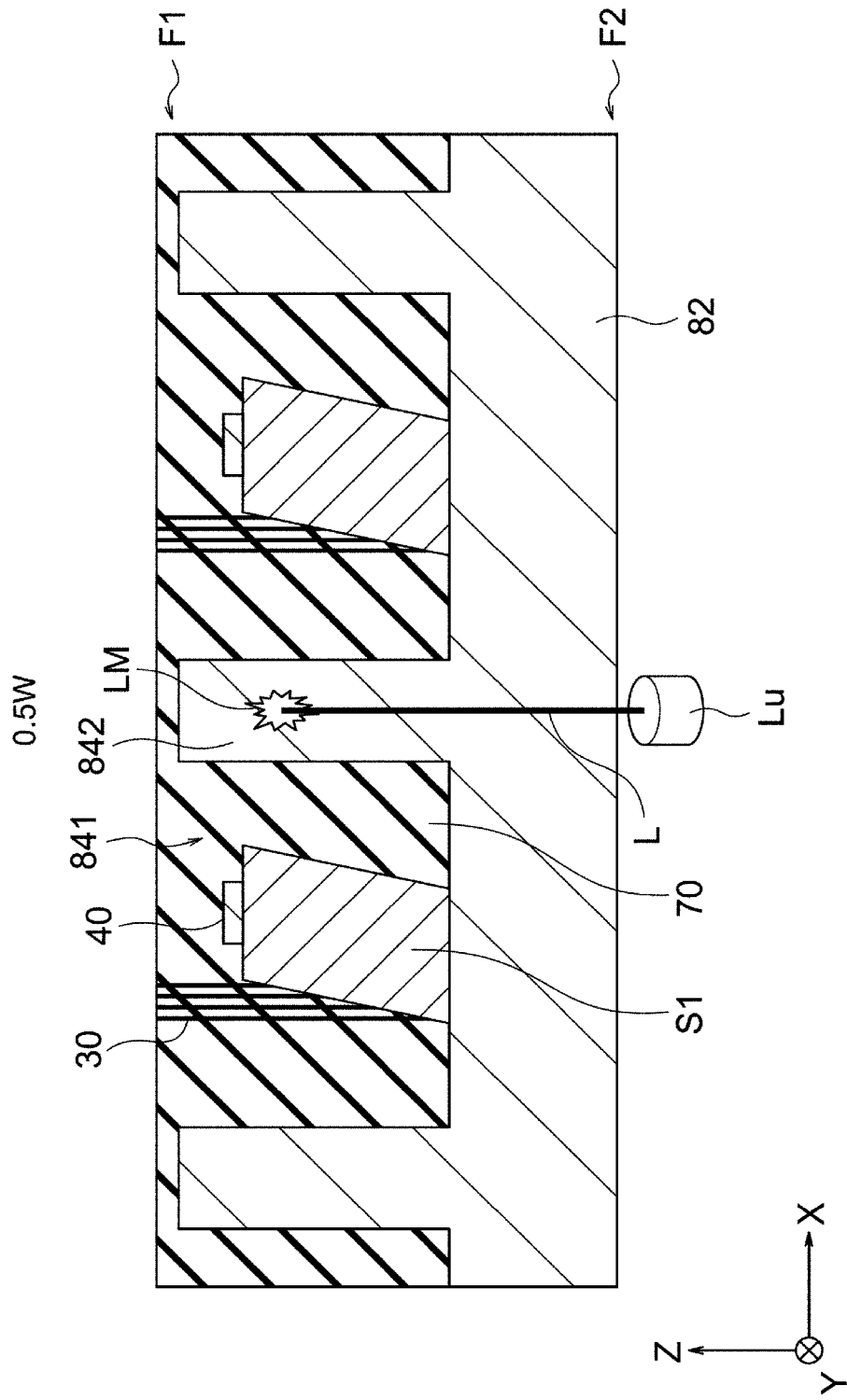

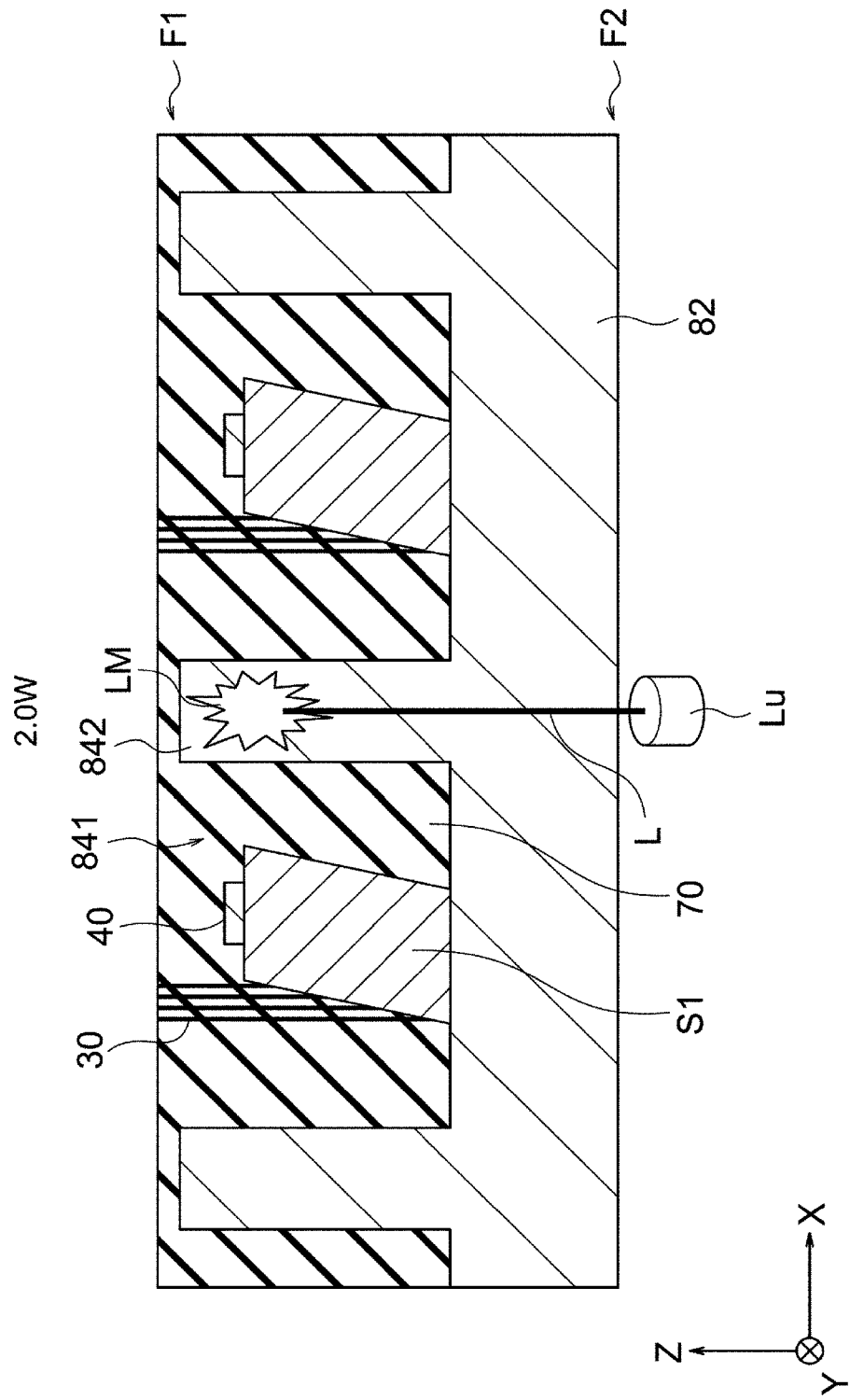

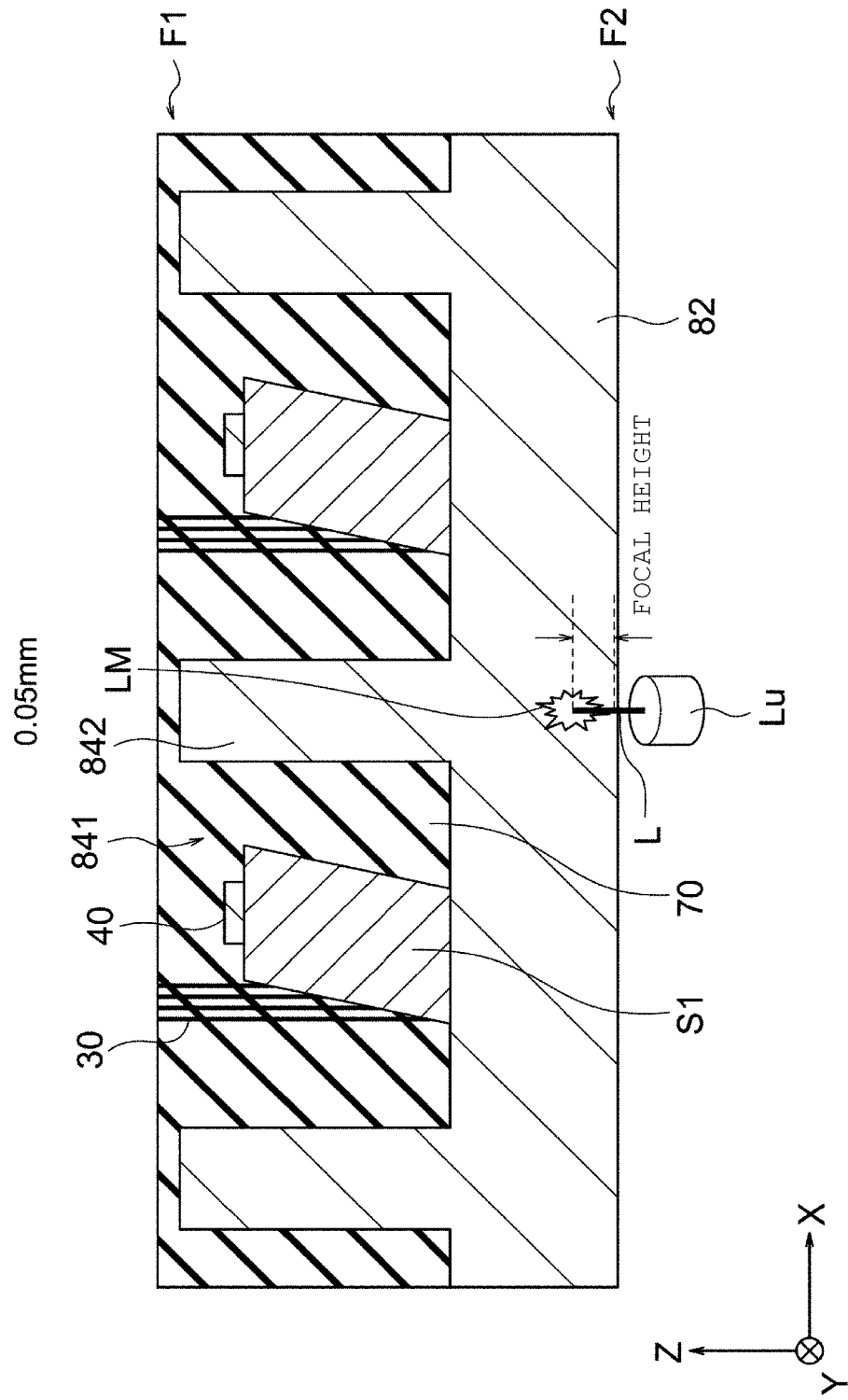

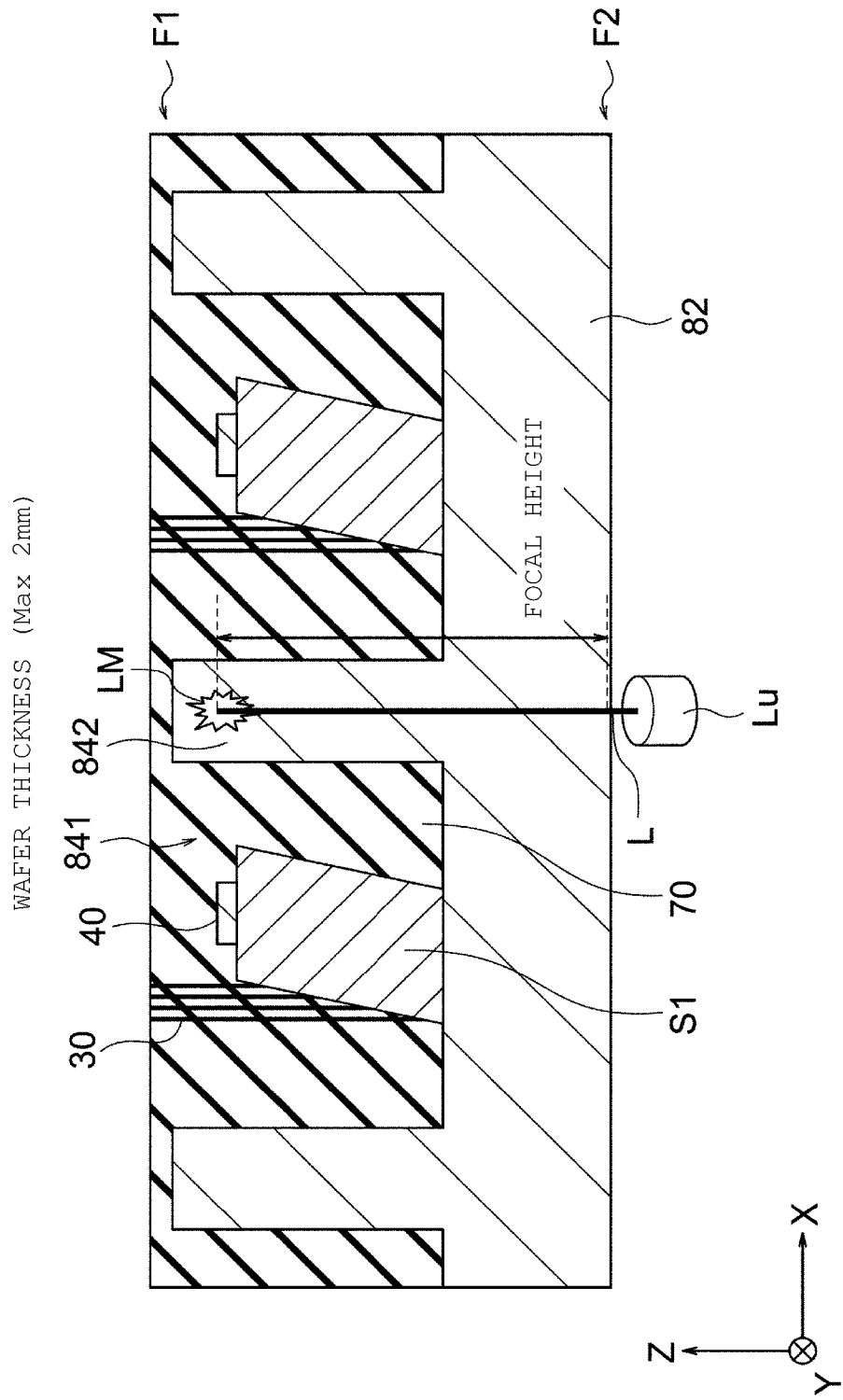

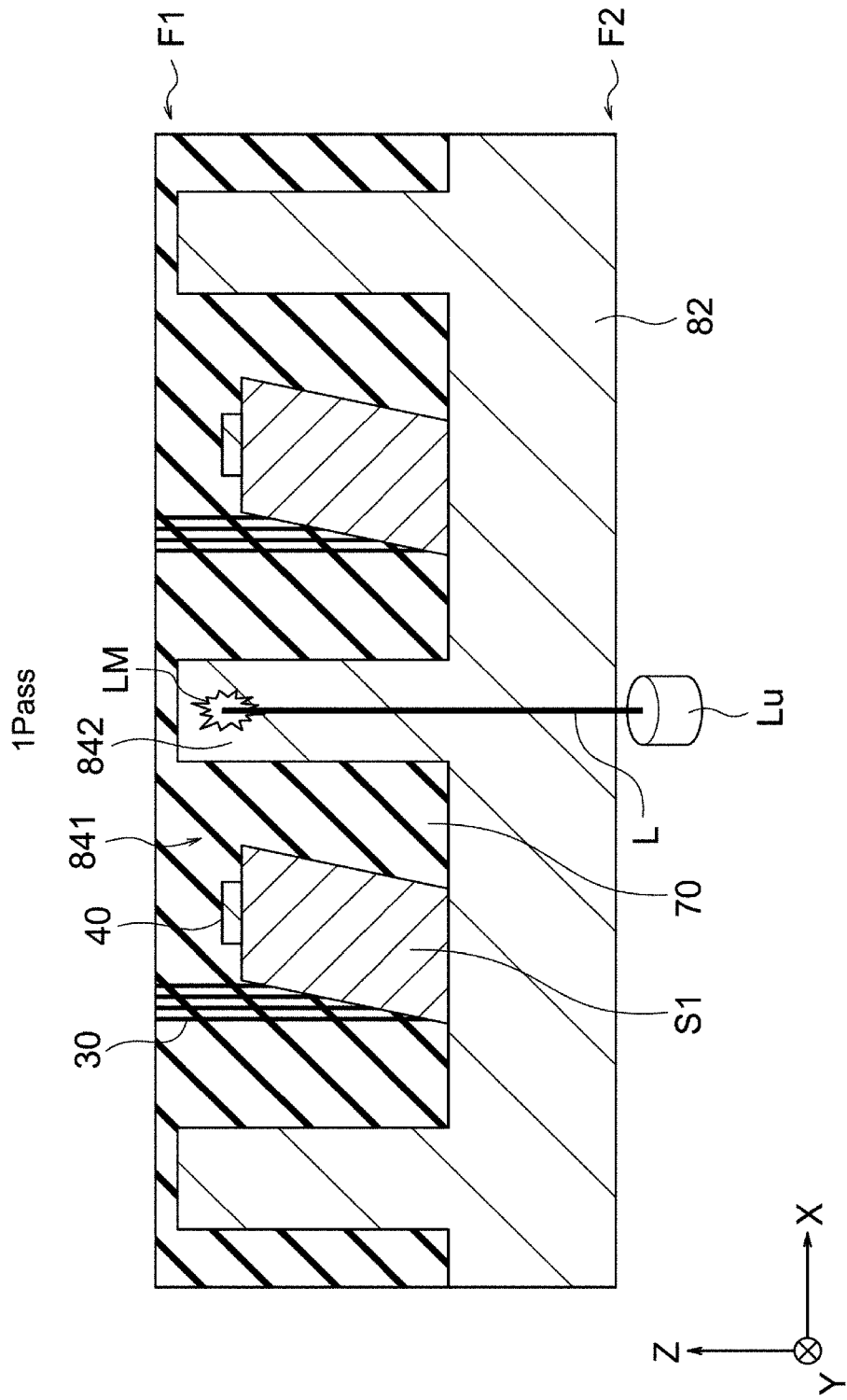

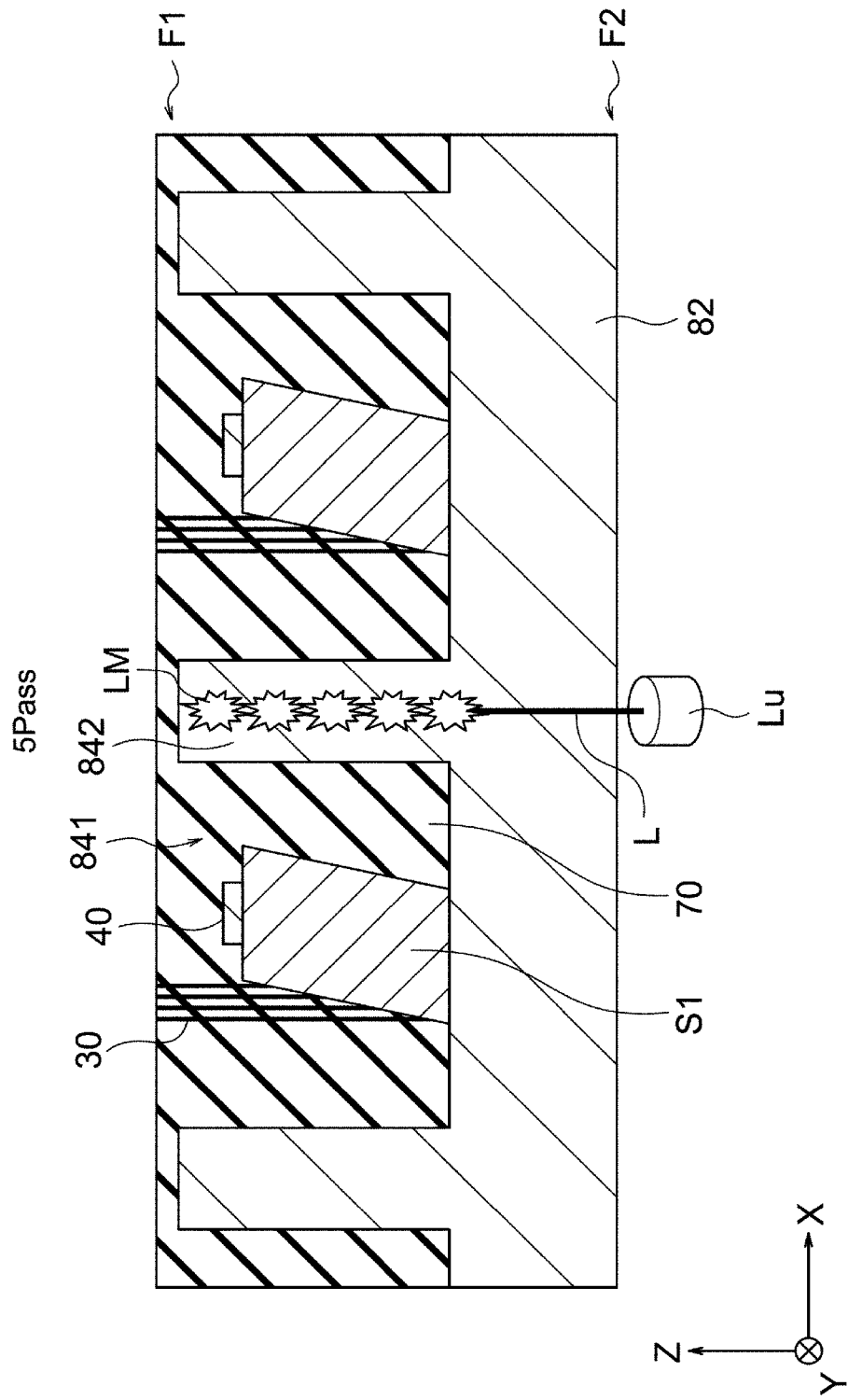

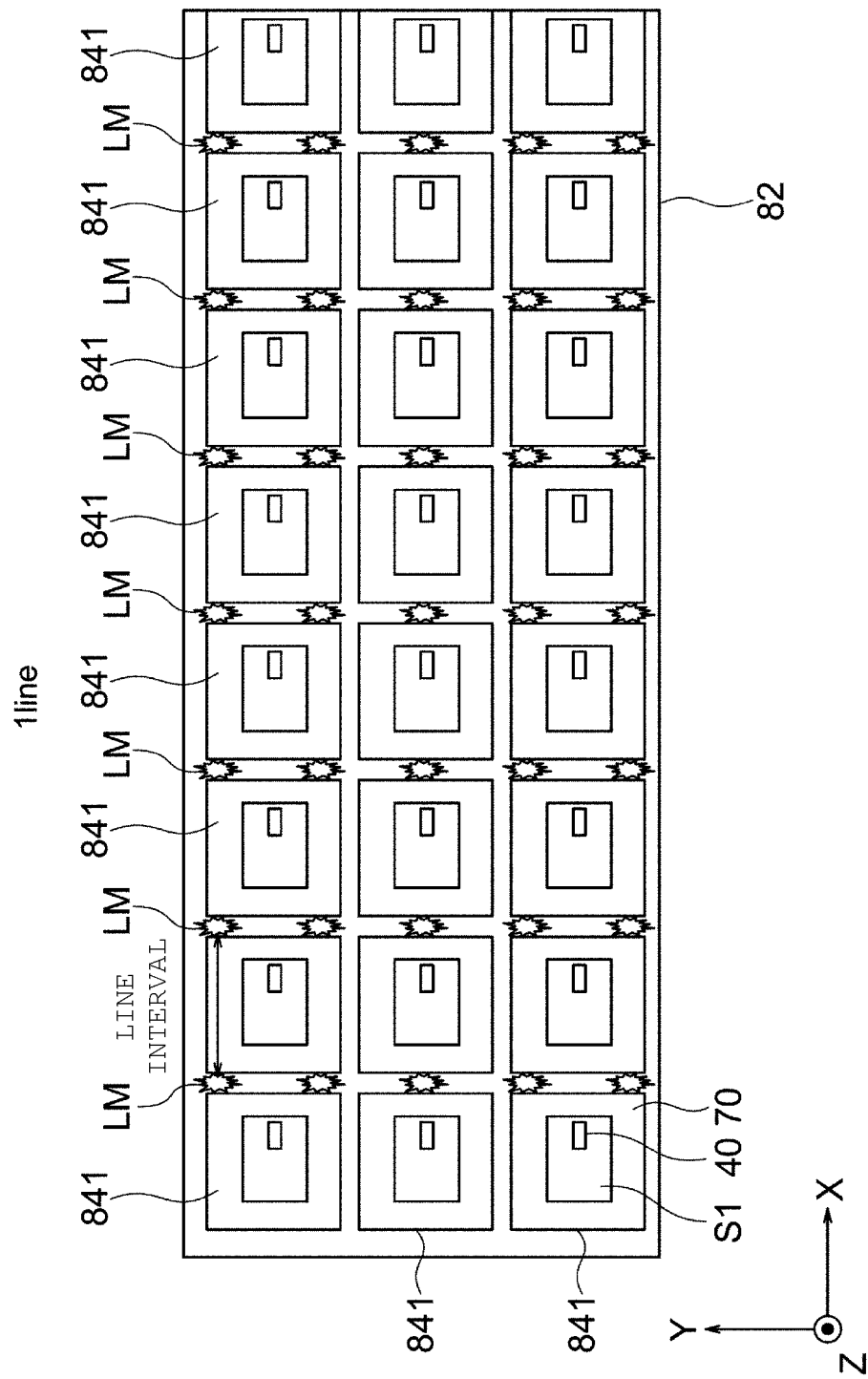

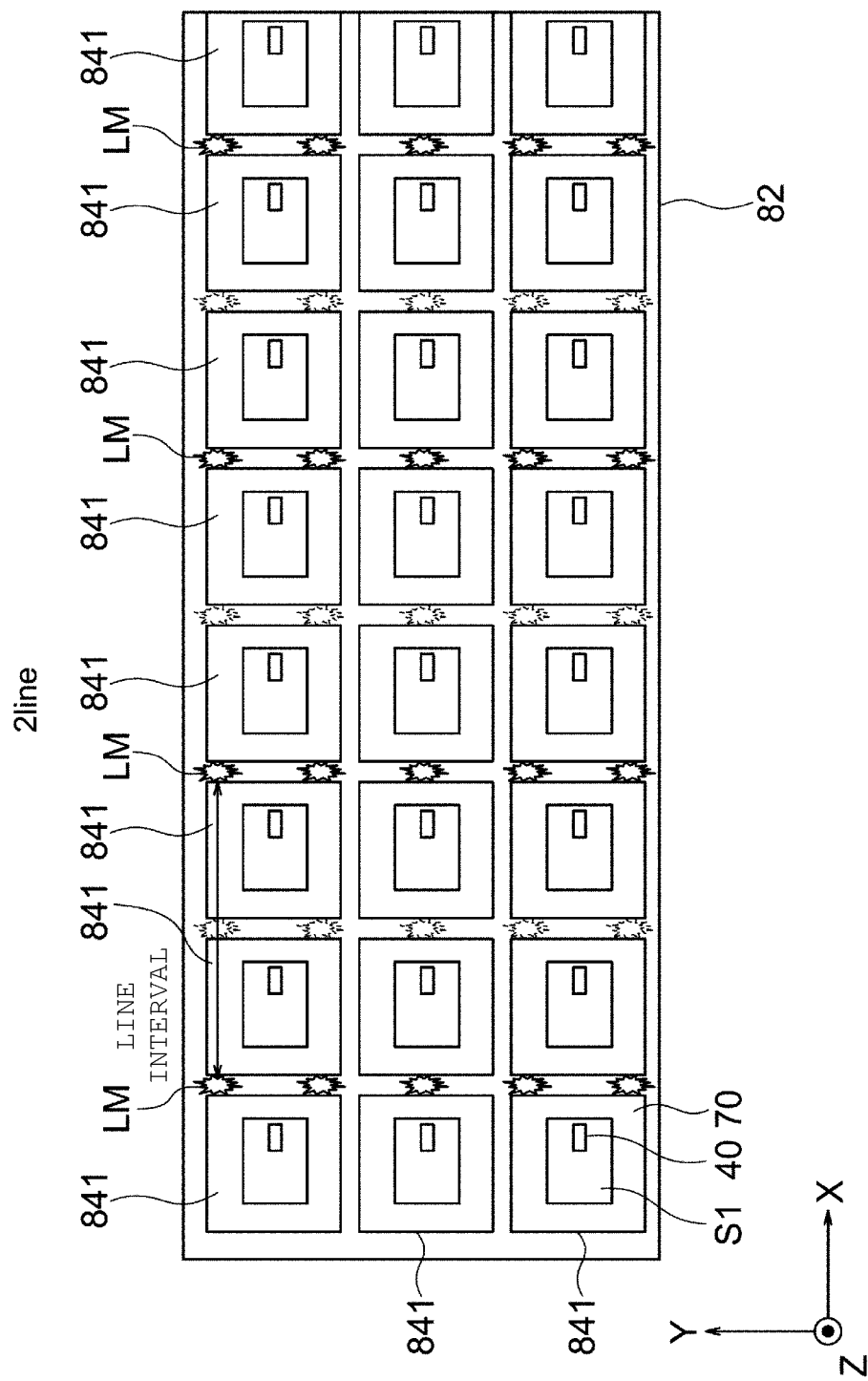

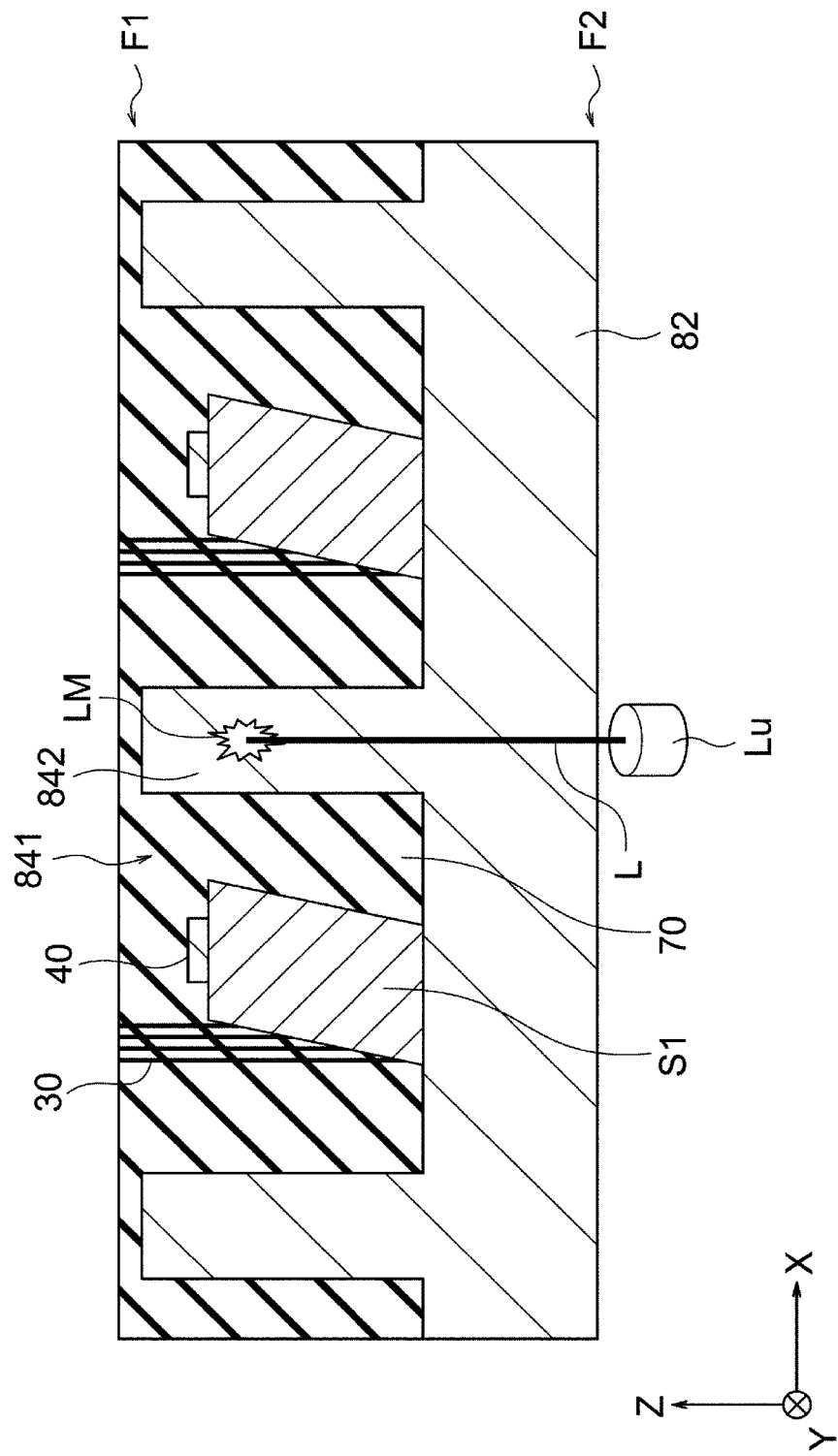

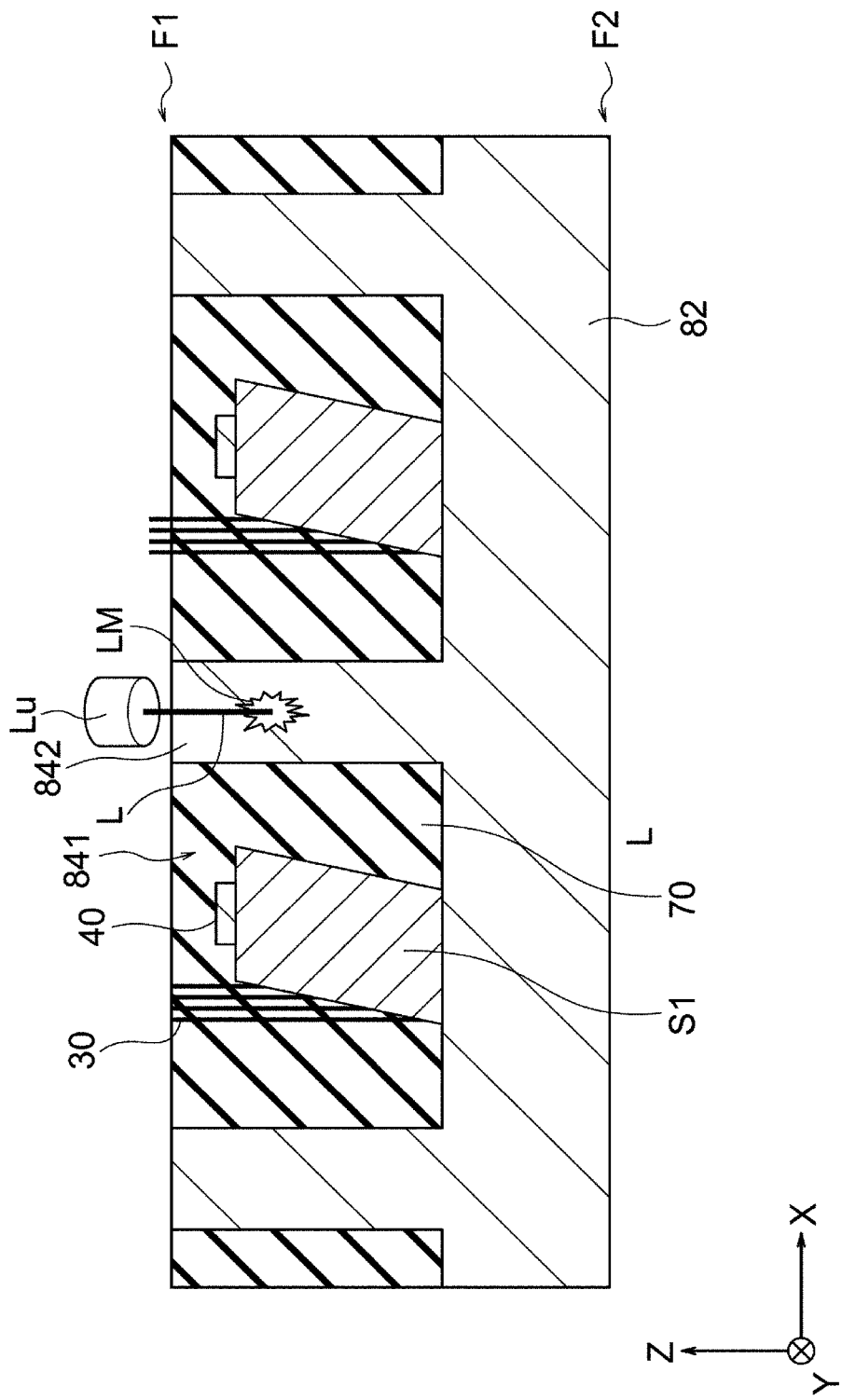

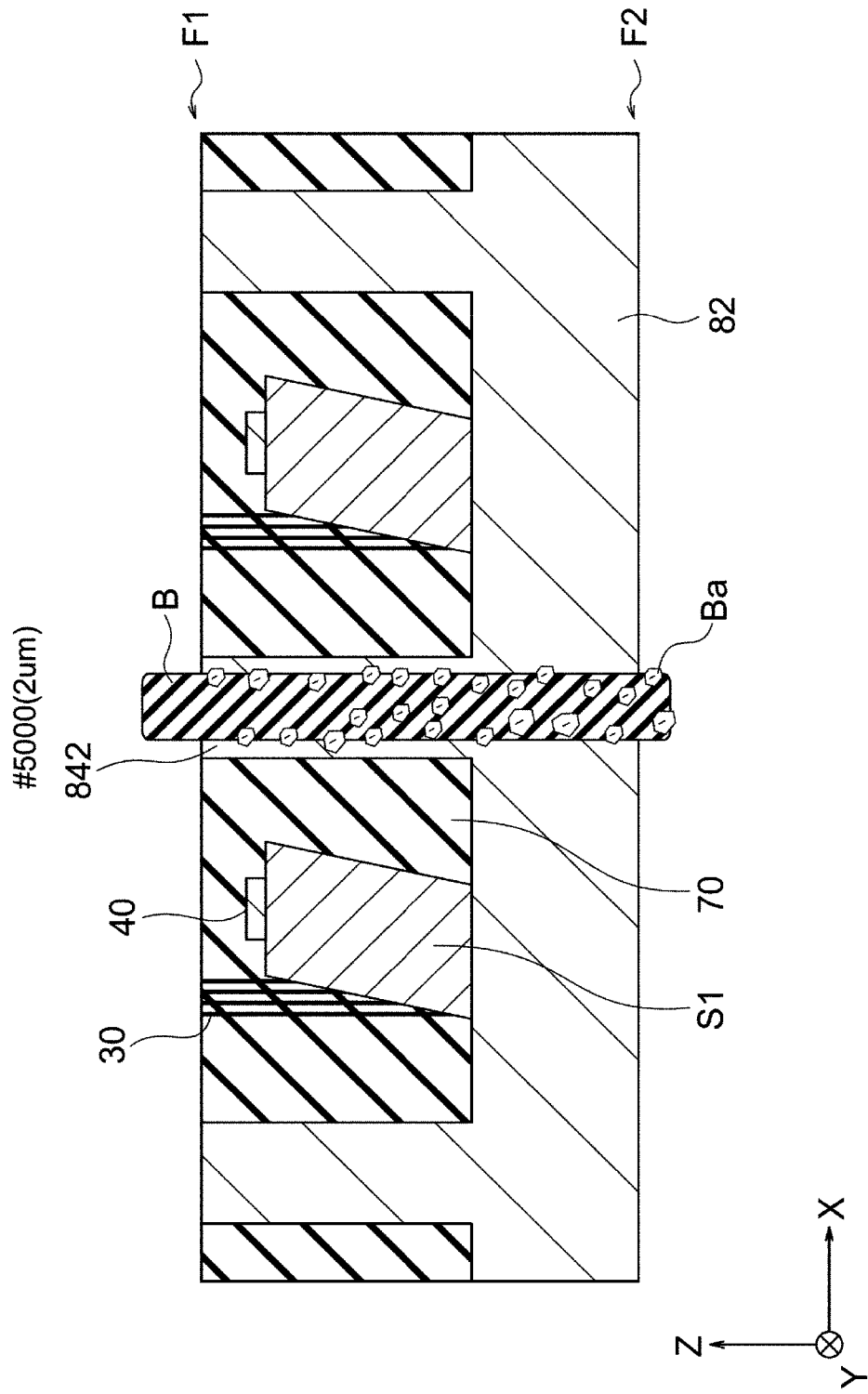

METHOD FOR MANUFACTURING SEMICONDUCTOR DEVICE AND SEMICONDUCTOR DEVICE

CROSS-REFERENCE TO RELATED APPLICATION

This application is based upon and claims the benefit of priority from Japanese Patent Application No. 2021-094631, filed Jun. 4, 2021, the entire contents of which are incorporated herein by reference.

FIELD

Embodiments described herein relate generally to a method for manufacturing a semiconductor device and a semiconductor device.

BACKGROUND

In a process of manufacturing a semiconductor device, memory chips can be stacked on a support at a plurality of positions and then covered with a mold resin. Subsequently, the support is divided into pieces. However, the support may be warped due to a difference in thermal expansion coefficient between the support and the mold resin. Warpage of the support affects processing of the support, such as division of the support into pieces.

BRIEF DESCRIPTION OF THE DRAWINGS

FIG. 2 depicts an example of a configuration of a semiconductor device in a bottom view according to a first embodiment.

FIGS. 3A to 3K are cross-sectional views illustrating aspects related to a method for manufacturing a semiconductor device according to a first embodiment.

FIGS. 4A and 4B depict aspects related to laser output.
FIGS. 5A and 5B depict aspects related to focal height.
FIGS. 6A and 6B depict aspects related to pass number.

FIGS. 8A and 8B depict aspects related to an irradiation line interval.

FIG. 9A depicts an example of an irradiation direction.
FIG. 9B depicts another example of an irradiation direction.

FIG. 14B depicts another example of a grain size.

DETAILED DESCRIPTION

Figure 1:
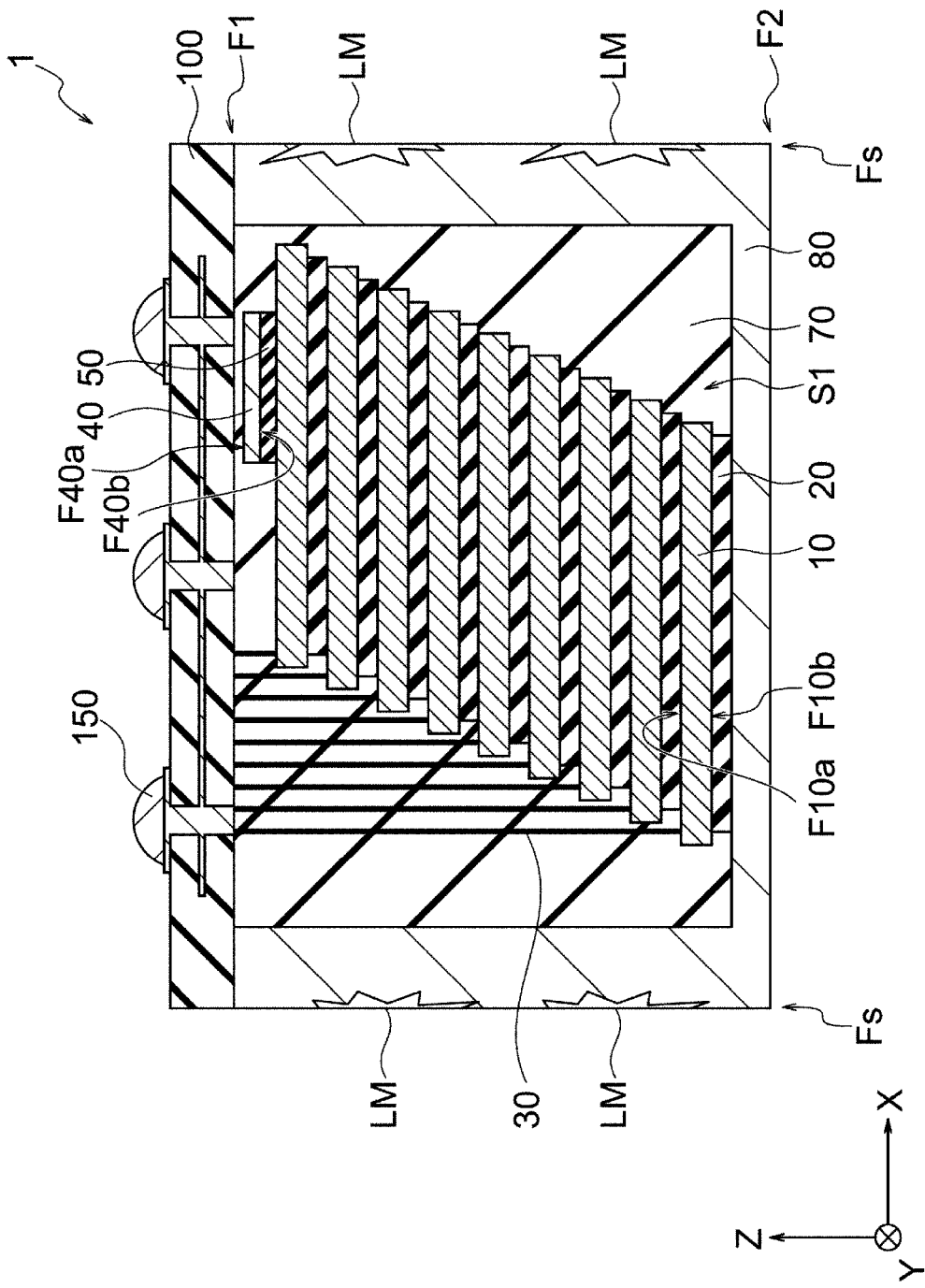
FIG. 1 depicts an example of a configuration of a semiconductor device in a cross-sectional view according to a first embodiment.

Embodiments provide a method for manufacturing a semiconductor device in which warpage of a support and a semiconductor device can be prevented or mitigated.

In general, according to one embodiment, a method for manufacturing a semiconductor device includes forming a plurality of recess portions on a first surface of a support. Each recess portion is between protrusion portions on the first surface. A stacked body is then placed into each of the recess portions. The stacked body is a plurality of semiconductor chips stacked on each other or the like. The recess portions are filled with a resin layer. The resin layer covers the stacked bodies inside the recess portions. A protrusion portion of the support is irradiated with a laser beam to form a modified portion in the protrusion portion. The support is divided along the protrusion portions into separate pieces.

Hereinafter, certain example embodiments will be described with reference to the accompanying drawings. The present disclosure is not limited to these example embodiments. The drawings are schematic or conceptual, and ratios of portions, dimensions, and the like are not necessarily the same as the actual ratios, dimensions, and the like. In the specification and the drawings, components or aspects substantially similar to one another and already discussed in connection with a previous drawing or drawings are denoted with the same reference numerals, and descriptions of such components or aspects may be omitted as appropriate from subsequent description of embodiments and/or drawings.

First Embodiment

FIG. 1 is a cross-sectional view illustrating an example of a configuration of a semiconductor device 1 according to a first embodiment. The semiconductor device 1 includes a stacked body S1, a columnar electrode 30, a semiconductor chip 40, an adhesion layer 50, a resin layer 70, a member 80, a redistribution layer 100, and a metal bump 150. The redistribution layer 100 may be a substrate, circuit substrate, board, or the like in some examples. For example, the semiconductor device 1 may be a semiconductor package, such as a NAND-type flash memory or a large-scale integration (LSI).

The stacked body S1 includes a plurality of semiconductor chips 10 and a plurality of adhesion layers 20. For example, each adhesion layer 20 is a die attachment film (DAF). The stacked body S1 is provided beneath the redistribution layer 100. A stacking direction of the stacked body S1 is a normal (Z direction in the drawing) to the surface of the redistribution layer 100.

Each of the semiconductor chips 10 has a first surface F10a on one side and a second surface F10b on another side opposite to the first surface F10a. A semiconductor element (not separately depicted), such as a memory cell array, a transistor, or a capacitor, is formed on the first surface F10a of each of the semiconductor chips 10. The semiconductor element on the first surface F10a of each of the semiconductor chips 10 is covered with an insulating film for protection. For the insulating film, for example, an inorganic insulating material, such as a silicon oxide film or a silicon nitride film, is used. For the insulating film, a material in which an organic insulating material is formed on an inorganic insulating material may be used. As an organic insulating material, a resin such as a phenolic resin, a polyimide resin, a polyamide resin, an acrylic resin, an epoxy resin, a p-phenylenebenzobisoxazole (PBO) resin, a silicone resin, or a benzocyclobutene resin can be used. In some examples, the organic insulating material can be a mixture or a composite material of the above materials. Each semiconductor chip 10 may be, for example, a memory chip of a NAND-type flash memory or a semiconductor chip equipped with an LSI. The semiconductor chips 10 may have the same configurations with each other or different configurations from each other.

The semiconductor chips 10 are stacked and bonded to each other by the adhesion layers 20. For each of the adhesion layers 20, a resin, such as a phenolic resin, a polyimide resin, a polyamide resin, an acrylic resin, an epoxy resin, a p-phenylenebenzobisoxazole (PBO) resin, a silicone resin, or a benzocyclobutene resin, or an organic insulating material can be used. In some examples, the adhesion layer 20 may be a mixture or a composite material of the above materials. Each of the semiconductor chips 10 has an exposed electrode pad on the first surface F10a. Each upper one of the semiconductor chips 10 (may also be referred to as an upper semiconductor chip 10) is stacked on each corresponding lower one of the semiconductor chips 10 (may also be referred to as a lower semiconductor chip 10) at a slightly shifted position in a direction (X direction in the drawing) substantially perpendicular to the chip stacking direction (Z direction in the drawing) such that the upper semiconductor chip 10 does not overlap the exposed electrode pad on the first surface F10a of the corresponding lower semiconductor chip 10.

The exposed electrode pad on each of the semiconductor chips 10 is electrically connected to the semiconductor element on the same semiconductor chip 10. For the electrode pad, a low-resistance metal or material such as copper (Cu), nickel (Ni), tungsten (W), gold (Au), silver (Ag), palladium (Pd), tin (Sn), bismuth (Bi), zinc (Zn), chromium (Cr), aluminum (Al), titanium (Ti), tantalum (Ta), titanium nitride (TiN), tantalum nitride (TaN), or chromium nitride (CrN), or composites or alloys of such materials may be used.

The columnar electrode 30 is connected to the electrode pad of the semiconductor chip 10 in each layer and extends in the chip stacking direction (Z direction). Each adhesion layer 20 is partially removed to expose at least a part of the electrode pad in each layer so that the columnar electrode 30 can be connected to the corresponding electrode pad. Alternatively, each adhesion layer 20 is attached to the second surface F10b of the corresponding upper semiconductor chip 10 in a manner that does not overlap the electrode pad of the corresponding lower semiconductor chip 10. A lower end of the columnar electrode 30 is connected to the electrode pad by, for example, wire bonding. An upper end of the columnar electrode 30 reaches an upper surface of the resin layer 70 and is exposed on that upper surface. The exposed upper end is then connected to an electrode pad of the redistribution layer 100.

The semiconductor chip 40 has a first surface F40a on one side and a second surface F40b on another side opposite to the first surface F40a. A semiconductor element (not separately depicted), such as a transistor or a capacitor, is formed on the first surface F40a of the semiconductor chip 40. The semiconductor element on the first surface F40a of the semiconductor chip 40 is covered with an insulating film for protection. For the insulating film, for example, an inorganic insulating material, such as a silicon oxide film or a silicon nitride film, is used. For the insulating film, a material in which an organic insulating material is formed on an inorganic insulating material may be used. As the organic insulating material, a resin such as a phenolic resin, a polyimide resin, a polyamide resin, an acrylic resin, an epoxy resin, a p-phenylenebenzobisoxazole (PBO) resin, a silicone resin, or a benzocyclobutene resin can be used. In other examples, a mixture or a composite material of the above materials may be used. As one example, the semiconductor chip 40 may be a controller chip that controls each semiconductor chip 10, such as a memory chip, of the stacked body S1. As another example, the semiconductor chip 40 may be a semiconductor chip equipped with an LSI.

The semiconductor chip 40 is stacked on the uppermost one of the semiconductor chips 10 and bonded to the uppermost semiconductor chip 10 via the adhesion layer 50. The semiconductor chip 40 has an exposed electrode pad (not separately depicted) on the first surface F40a. For example, the electrode pad on the first surface F40a of the semiconductor chip 40 is electrically connected to the electrode pad (not separately depicted) of the redistribution layer 100 via a connection pillar or a connection bump. As a material of the connection pillar or the connection bump, for example, a conductive metal, such as Cu, may be used.

The stacked body S1, the semiconductor chip 40, and the columnar electrode 30 are covered or sealed with the resin layer 70, and the upper end of the columnar electrode 30 and an edge or a tip of the connection pillar of the semiconductor chip 40 are exposed on the upper surface of the resin layer 70.

For the resin layer 70 (also referred to as molded resin layer 70), a resin such as a phenolic resin, a polyimide resin, a polyamide resin, an acrylic resin, an epoxy resin, a p-phenylenebenzobisoxazole (PBO) resin, a silicone resin, or a benzocyclobutene resin, or other organic insulating material may be used. Additionally, the resin layer 70 may be a mixture or a composite material of such resin materials.

The member 80 covers or surrounds the resin layer 70. The member 80 has a first member surface F1 on one side and a second member surface F2 on another side opposite to the first member surface F1. In the member 80, a recess portion is formed through the first member surface F1 into the member 80, and the stacked body S1 is provided in the recess portion. The first member surface F1 is in contact with the redistribution layer 100. The member 80 has one or more modified portions (may also be referred to as modified layers or expansion layers) LM on one or more side surfaces Fs between the first and second member surfaces F1 and F2. For example, each modified portion LM may be a laser trace.

The member 80 is made of a material that allows the modified portion LM to form upon irradiation with a laser beam. For example, the material has a characteristic or a property such that a laser beam L can penetrate and can be focused for the formation of the modified portion LM. Such material may be, for example, silicon (Si). The member 80 has higher adhesion during shield sputtering than the resin layer 70. Thus, the adhesion during shield sputtering can be enhanced. That is, as compared with a case where the resin layer 70 is exposed without providing the member 80, a metal film functioning as a magnetic shield can easily be provided on a package surface.

The redistribution layer 100 (RDL 100) is provided on the resin layer 70 and is electrically connected to the columnar electrode 30. The redistribution layer 100 is a multi-layer wiring layer in which a plurality of wiring layers (as schematically depicted in FIG. 1) and a plurality of insulating layers are stacked. The redistribution layer 100 electrically connects the semiconductor chips 10 to the metal bump 150 via the columnar electrode 30 and electrically connects the semiconductor chip 40 to the metal bump 150.

The metal bump 150 is disposed on the redistribution layer 100 and electrically connected to one or more of the wiring layers of the redistribution layer 100. The metal bump 150 is used in connection to an external device. For the metal bump 150, a material such as tin (Sn), silver (Ag), copper (Cu), gold (Au), palladium (Pd), bismuth (Bi), zinc (Zn), nickel (Ni), antimony (Sb), indium (In), or germanium (Ge) or a composites or alloys thereof can be used.

FIG. 2 is a bottom view illustrating the configuration of the semiconductor device 1 according to the first embodiment. Line A-A in FIG. 2 indicates the cross section of the semiconductor device 1 as depicted in FIG. 1.

The member 80 has the modified portions LM at every outer peripheral portion as viewed in the stacking direction (Z direction in the drawing) of the stacked body S1. Each outer peripheral portion corresponds to each of the side surfaces Fs of the outer periphery of the member 80. For example, each modified portion LM is a polycrystal region that is formed around a laser beam-focusing position by heating under focus of a laser beam L.

The modified portion LM locally expands under high temperature. Even when the modified portion LM is cooled after irradiation with a laser beam L, a stress due to expansion of the modified portion LM remains. This expansion stress effectively reduces warpage of the member 80 (or a support 82, such as a wafer, as shown in FIG. 3A, for example) prior to further processing of the member 80, such as a process of dividing the member 80 into pieces. Reduction of the support warpage improves the processing precision of the member 80 (or the support 82).

A region of the side surface Fs of the member 80 where the modified portion LM is not provided is a smooth surface that includes relatively less crystal defect and is a mirror surface with substantially no roughness. This is because the semiconductor device 1 is divided into pieces by cleavage of the member 80 (for example, as illustrated in FIG. 3K).

The semiconductor device 1 according to the first embodiment can be manufactured by a method as illustrated in FIGS. 3A to 3K.

As illustrated in FIG. 3A, a protrusion and recess pattern 84 is provided to the support 82, which is the member 80 (see FIG. 1). One example of the support 82 is a silicon wafer. In the drawing, first and second surfaces F1 and F2 of the support 82 are the same as the first and second member surfaces F1 and F2 of the member 80, respectively. The protrusion and recess pattern 84 is formed through the first surface F1 to inside of the support 82 and comprises a plurality of protrusion portions 842 and a plurality of recess portions 841. The protrusion portions 842 are provided as side walls of the recess portions 841.

As one example, a plurality of holes each with a predetermined depth are formed on the first surface F1 of the support 82 as the recess portions 841 by an appropriate process, such as sand blasting, a blade cutting, plasma etching, reactive ion etching (RIE), or wet etching. Part of the remaining portion of the support 82 after the hole formation provides the protrusion portions 842 as the side walls of the holes.

Subsequently, one (or a first chip or layer) of the semiconductor chips 10 is provided and bonded via one (or a first layer) of the adhesion layers 20 to inside (for example, a bottom surface in the Z direction) of each of the recess portions 841 as illustrated in FIG. 3B.

As illustrated in FIG. 3C, subsequent layers of the semiconductor chips 10 and subsequent layers of the adhesion layers 20 are alternately stacked on one another to form the stacked body S1 in each recess portion 841. Further, on the stacked body S1, that is, on the uppermost semiconductor chip 10, the semiconductor chip 40, such as a controller chip of the semiconductor chips 10, is provided and bonded via the adhesion layer 50.

As illustrated in FIG. 3D, the plurality of columnar electrodes 30 are formed on the corresponding semiconductor chips 10. Each columnar electrode 30 is formed to extend in the stacking direction. For example, the columnar electrode 30 extends above the first surface F1 of the support 82.

Figure 3E:
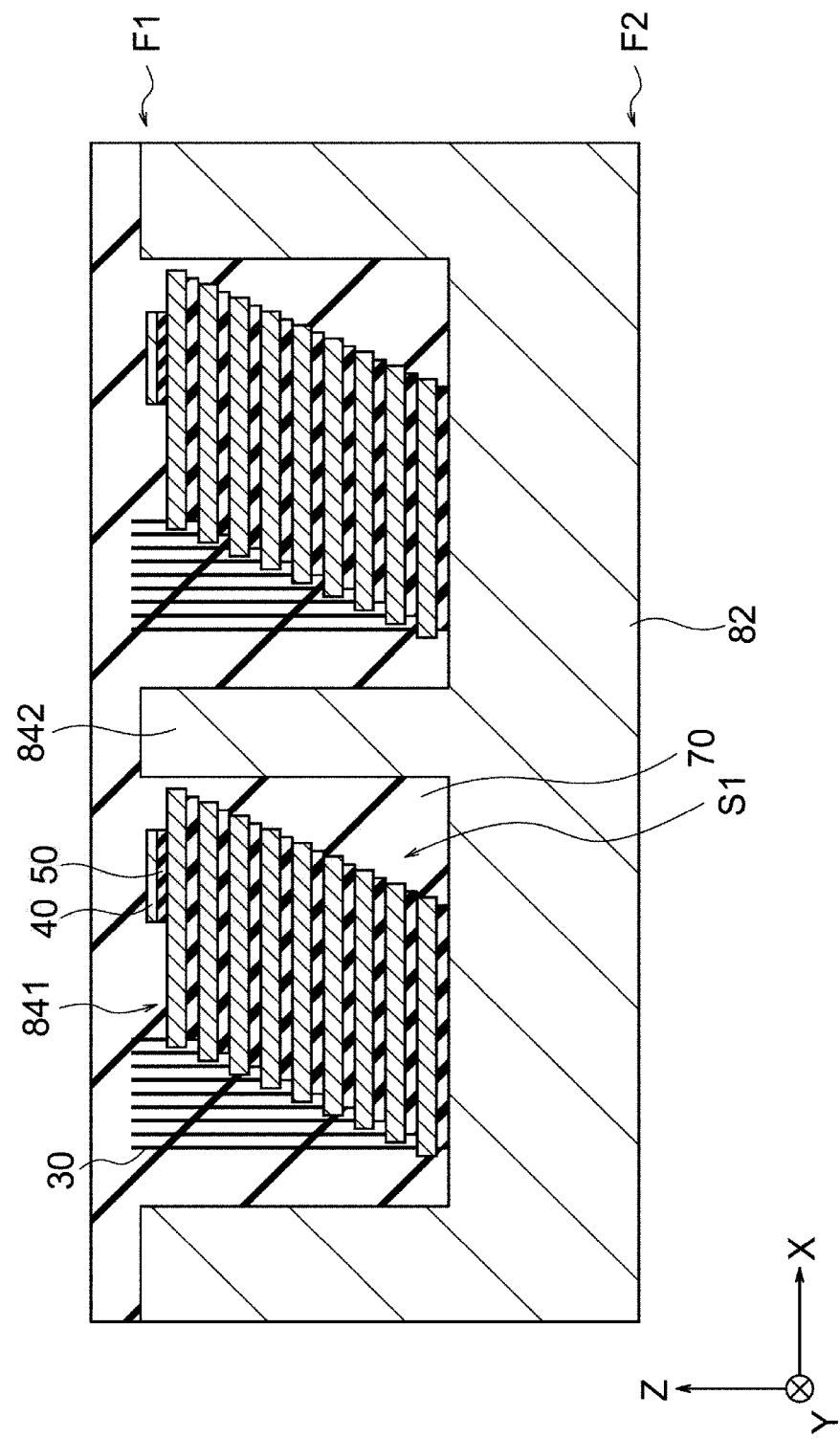

Subsequently, the resin layer 70 is provided in the recess portions 841 as illustrated in FIG. 3E. For example, the resin layer 70 is provided to fill the recess portions 841 and cover the surface F1 of the support 82. The resin layer 70 reaches above the surface F1 of the support 82.

In one instance, due to a difference in thermal expansion coefficient between the resin layer 70 and the support 82, the first surface F1 of the support 82 may easily shrink as compared with the second surface F2. This may cause the support 82 to warp in a convex shape such that edge portions of the support 82 deform upwards while a center portion of the support 82 deforms downwards.

Figure 3F:
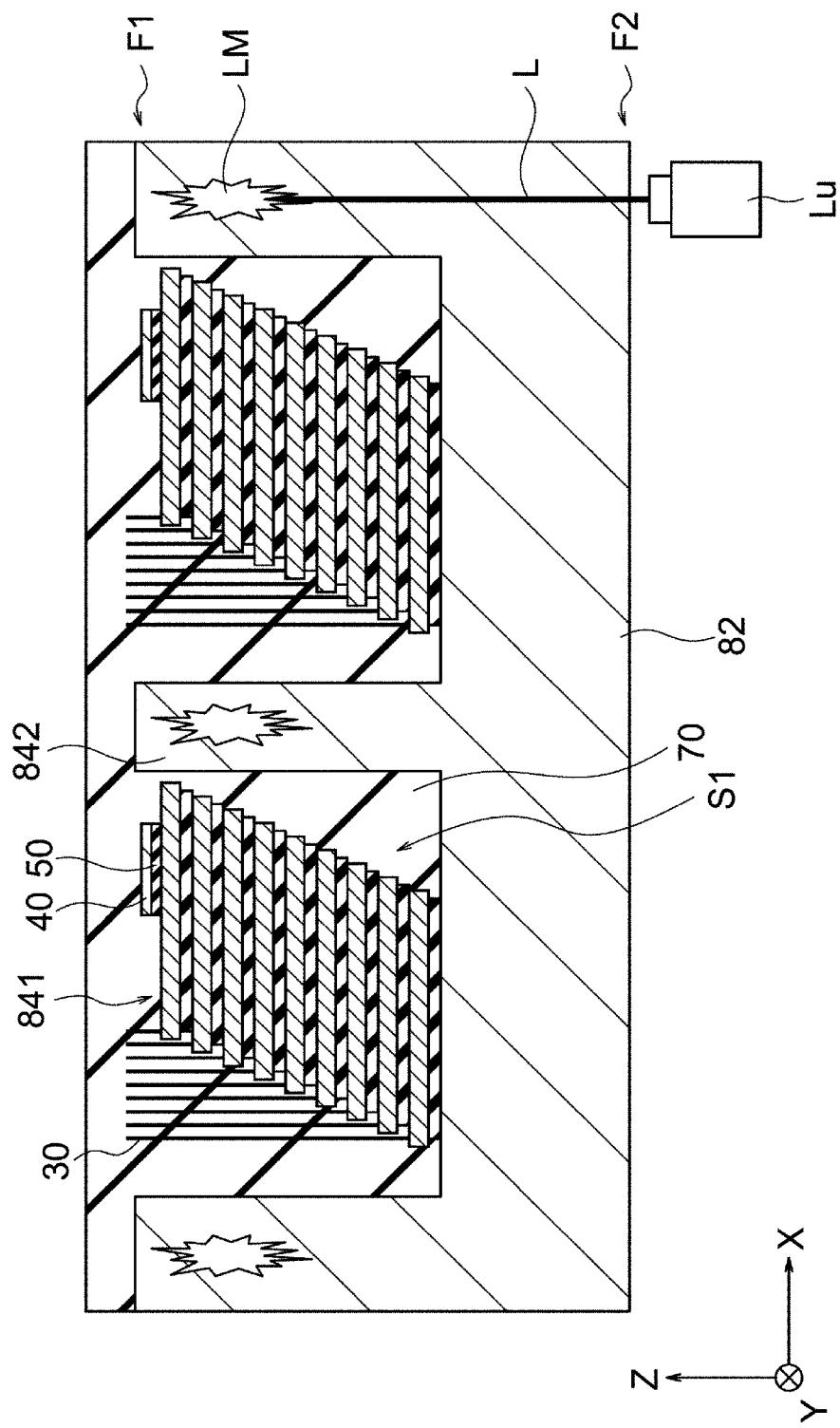

As illustrated in FIG. 3F, the support 82 is irradiated with a laser beam L from the second surface F2 along each of the protrusion portion 842 to form the modified portion LM at a position where the laser beam L is focused in the protrusion portion 842. Around the thus-formed modified portion LM, a stress is locally generated due to expansion inside the support 82. When the plurality of modified portions LM are formed, the stress due to expansion accumulates. This generates the expansion stress in every protrusion portion 842 where the modified portions have been formed. If the expansion stress is generated such that the support 82 warps in a direction (or in a concave shape) opposite to the direction (or the convex shape) of the warpage of the support 82 caused by the resin layer formation (FIG. 3E), the warpage of the support 82 can be corrected or reduced, and further warpage can be prevented.

In particular, the support 82 is irradiated with a laser beam L according to the warpage of the support 82 on which the resin layer 70 has been provided. By adjusting the conditions (parameters) of the laser beam L emitted, the degree of correction of the warpage can be controlled. For example, when the warpage of the support 82 is large, the laser beam L can be emitted in a manner in which the degree of warpage correction is also large. For example, emission conditions or adjustable parameters related to the laser beam L include a laser output (e.g., a power or intensity level), a focal height placement, a pass number, an irradiation interval, and an irradiation direction.

Before the formation of the modified portions LM, the size of the warpage of the support 82 can be detected. For example, a support 82 (such as a wafer) that has undergone the process of the resin layer formation is placed on a planar surface, and the height of an outer edge of the support 82 that is separated from the plane by warpage can be measured with a thickness gauge or the like. From the measured height, the amount of the warpage can be obtained. When a laser beam L is emitted using settings (conditions/parameters) adjusted to compensate and correct the measured amount of warpage, the warpage of the support 82 can appropriately be corrected. For subsequent processing of the support 82, it is generally preferable that the warpage of the support 82 be as small as possible after correction. As one example, a laser beam L can use settings such that the height of the outer edge of the support 82 will be separated from the plane by about 0.2 mm or less after the warpage correction. In some examples, cycles of the detection of the amount of the warpage of the support 82 followed by the formation of modified portions LM may be repeatedly performed in an iterative manner or the like to achieve the desired final amount of warpage (or lack thereof).

Figure 3G:
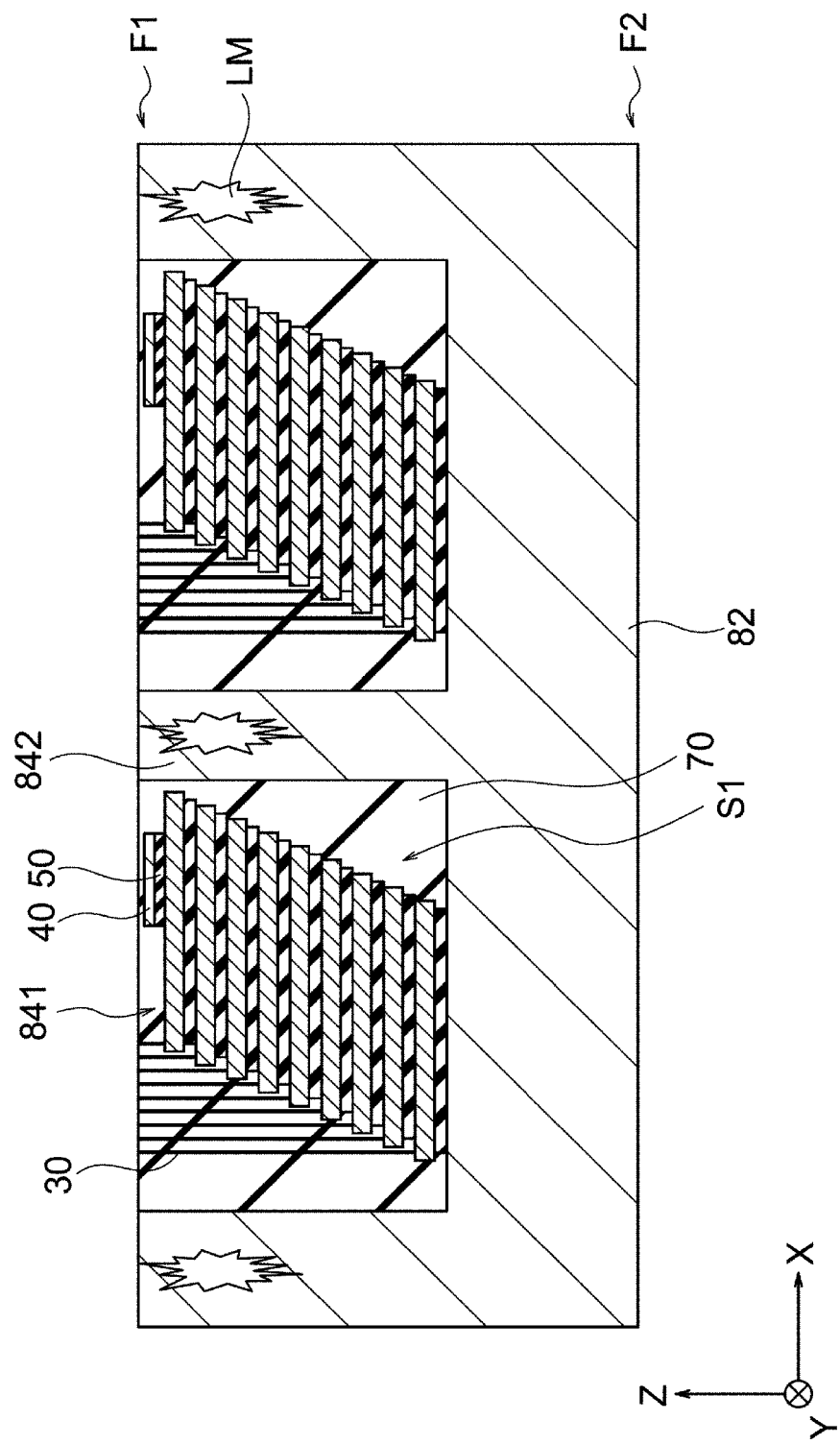
Figure 3H:
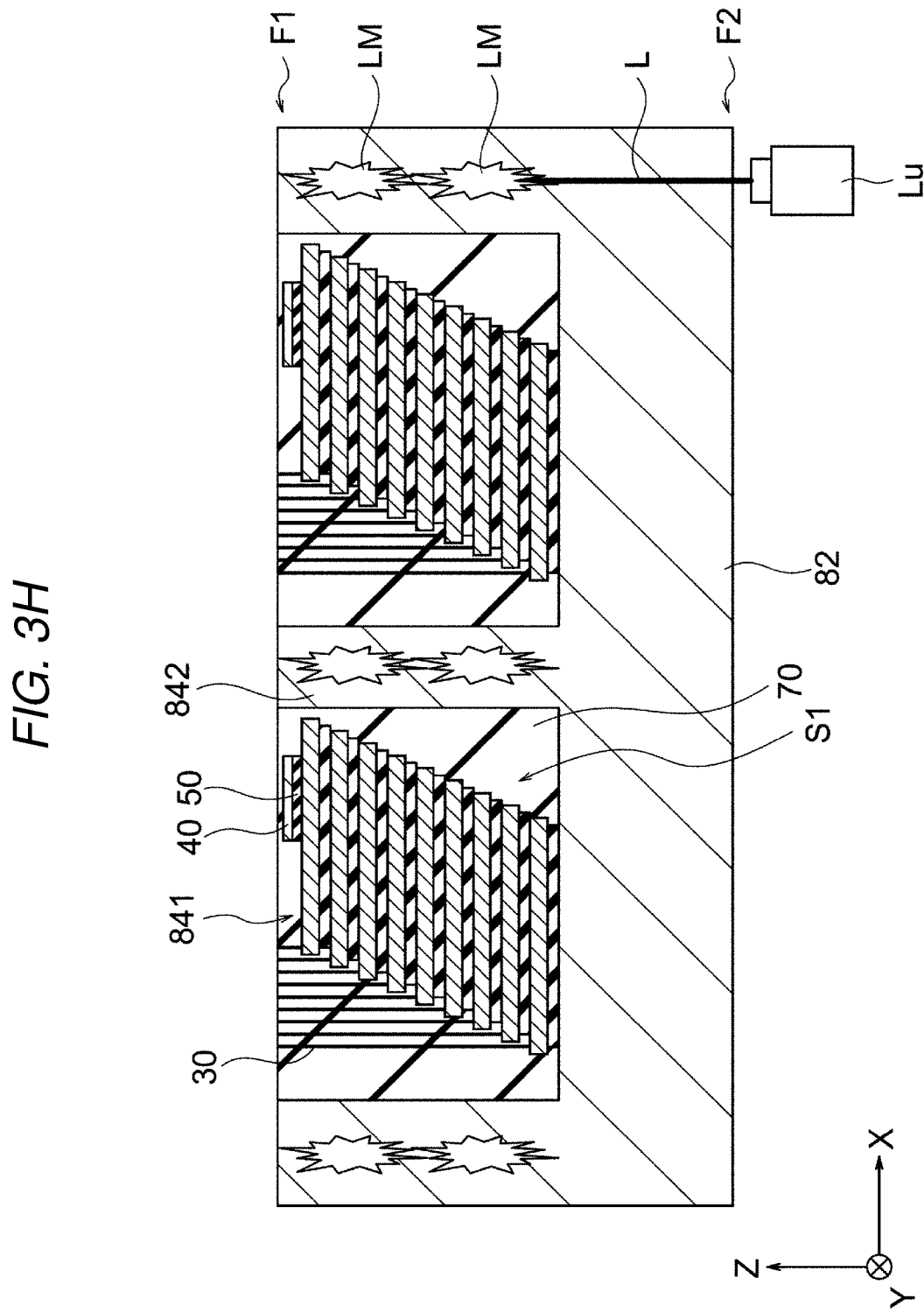

As illustrated in FIG. 3G, the resin layer 70 is then polished. For example, the resin layer 70 is polished until the protrusion portions 842 (the first surface F1 of the support 82) are exposed. That is, when the resin layer 70 is formed to a predetermined height above the first surface F1 of the support 82 as shown in FIG. 3E, an end point of polishing of the resin layer 70 can easily be determined.

As illustrated in FIG. 3H, the support 82 is again irradiated with a laser beam L from the surface F2 to further form another modified portion LM in each protrusion portion 842. When the part of the resin layer 70 was removed in the process of FIG. 3G, the warpage of the support 82 might have changed again. By further forming the modified portion (or portions) LM as needed, the warpage of the support 82 can be further adjusted. According to the state of the warpage of the support 82 after the polishing process of the resin layer 70, that is, if the size or degree of the warpage is still sufficiently small or negligible, the further formation of the modified portion LM may be omitted.

Subsequently, the redistribution layer 100 is formed on the polished resin layer 70 and on the exposed first surface F1 of the support 82 as illustrated in FIG. 3I. The redistribution layer 100 is formed to be electrically connected to the columnar electrode 30. After the formation of the redistribution layer 100, the metal bump 150 is formed on the redistribution layer 100.

Figure 3J:
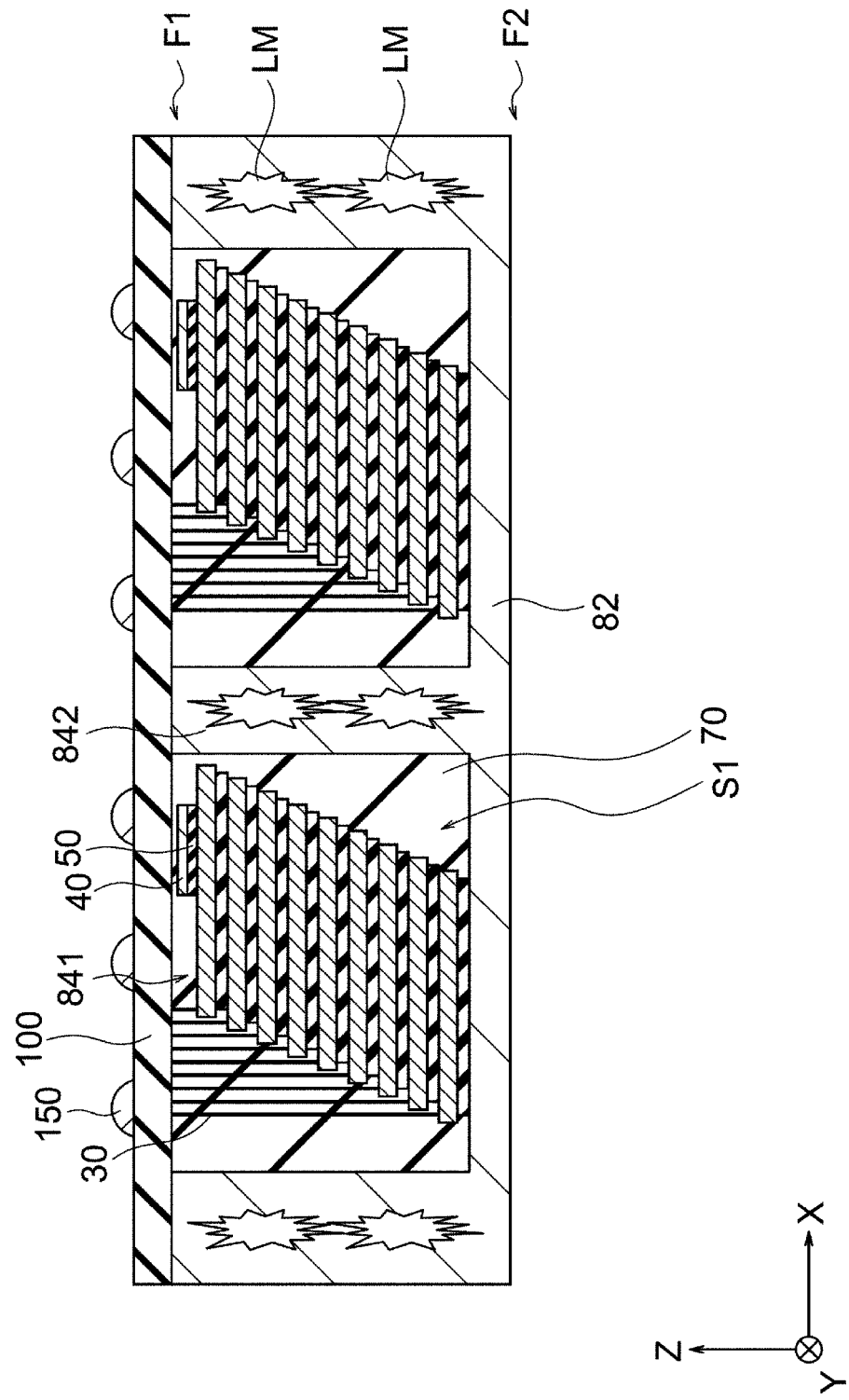
Figure 3K:
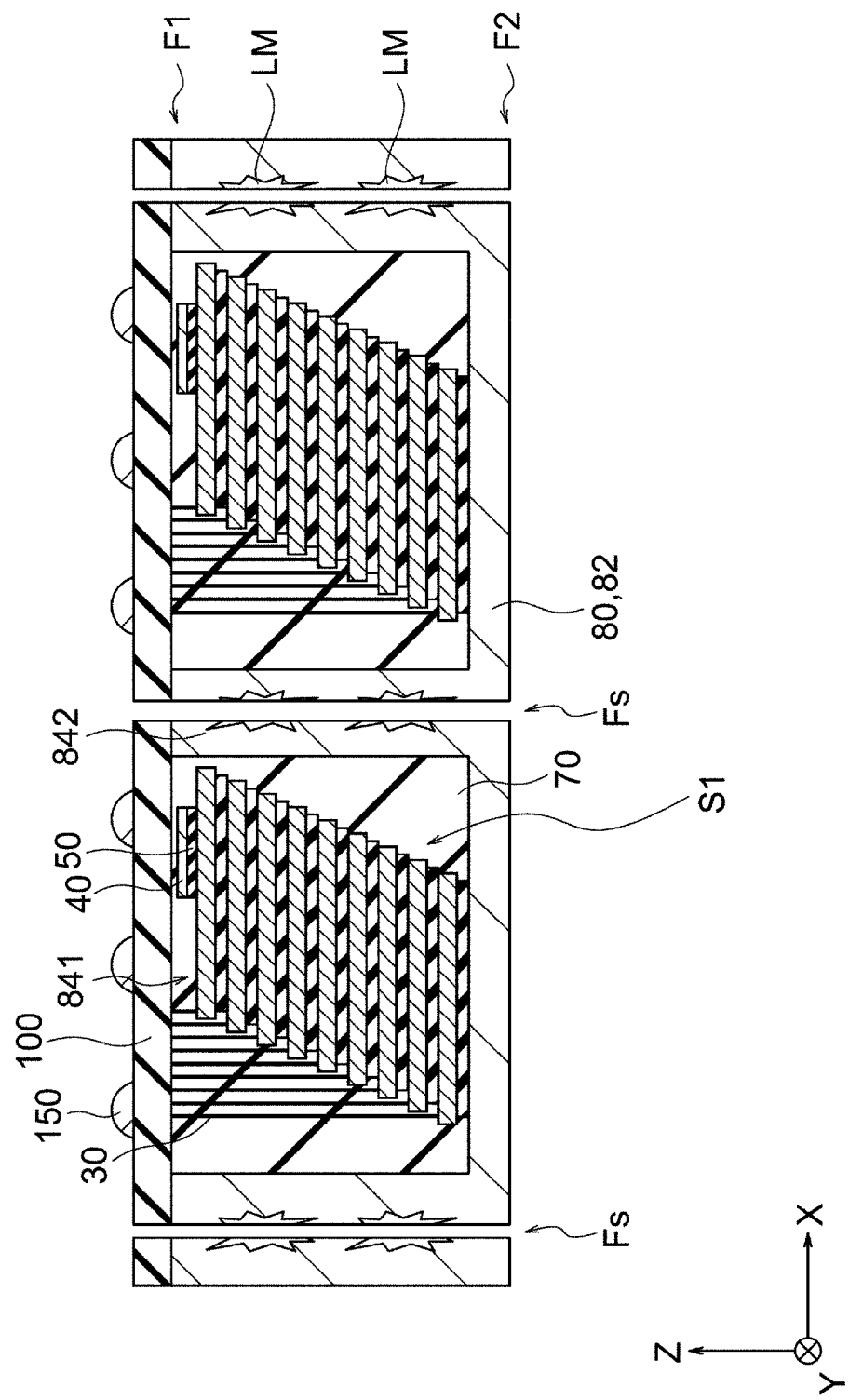

As illustrated in FIG. 3J, the second surface F2 that is a back surface of the support 82 is then polished.

Lastly, as illustrated in FIG. 3K, the support 82 (that is the member 80 in FIG. 1) is divided along the protrusion portions 842 into pieces. As one example, a stealth dicing process using the modified portions LM may be performed. In this stealth dicing process, by cleaving the support 82 at each of the modified portions LM as a starting point, the support 82 can be divided along the protrusion portions 842 into pieces. For example, the support 82 is attached to a dicing tape, and the dicing tape is pushed from below by a pressing member and then pulled or expanded. As a result, the support 82 is cleaved along the modified portions LM and divided into pieces. Since the modified portions LM that have been formed to improve the warpage are used also for dicing the support 82, the time and the number of processes for such dicing can be reduced.

After the process of FIG. 3K, the semiconductor device 1 as illustrated in FIG. 1 according to the first embodiment is completed.

According to the first embodiment, during the correction process of the warpage of the support 82, one or more conditions of the laser beam L may be adjusted.

As one example, a laser output or an energy density of the laser beam L may be adjusted to about 0.5 W and about 2.0 W as illustrated in FIGS. 4A and 4B, respectively.

In the example, the range of the laser output is from about 0.5 W to about 2.0 W. The adjustment of the laser output can change the degree of expansion stress of the modified portion LM. The greater the laser output is, the more the warpage is corrected.

As another example, a focal height of the laser beam L may be adjusted to about 0.05 mm and about 2.00 mm as illustrated in FIGS. 5A and 5B, respectively. The focal height is a distance between the second surface F2 of the support 82 on which the laser beam L is incident and a focal point of the laser beam L in the support 82 or the protrusion portion 842. The focal height can be adjusted up to or as close as possible to the thickness of the support 82. For example, in a case where the maximum thickness of a wafer as the support 82 is about 2.00 mm, the focal height of the laser beam L may be adjusted to about 2.00 mm as shown in FIG. 5B.

In the example, hence, the range of the focal height is from about 0.05 mm to the thickness of the support 82. The adjustment of the focal height can control a position where the laser beam L is focused inside the support 82, or a depth or a distance of the modified portion LM in the protrusion portion 842 from the second surface F2 of the support 82. The closer the modified portion LM is formed to the first surface F1, the more the warpage is corrected.

FIGS. 6A and 6B are schematic views illustrating aspects related to a pass number. In this context, "pass number" refers to the number of irradiation passes or events. FIGS. 6A and 6B illustrate pass numbers of 1 or 5, respectively.

In the example, the range of the pass number is from 1 to 5. The adjustment of the pass number can control the number of the modified portions LM to be formed. The greater the pass number is, the more the warpage is corrected.

Figure 7A:
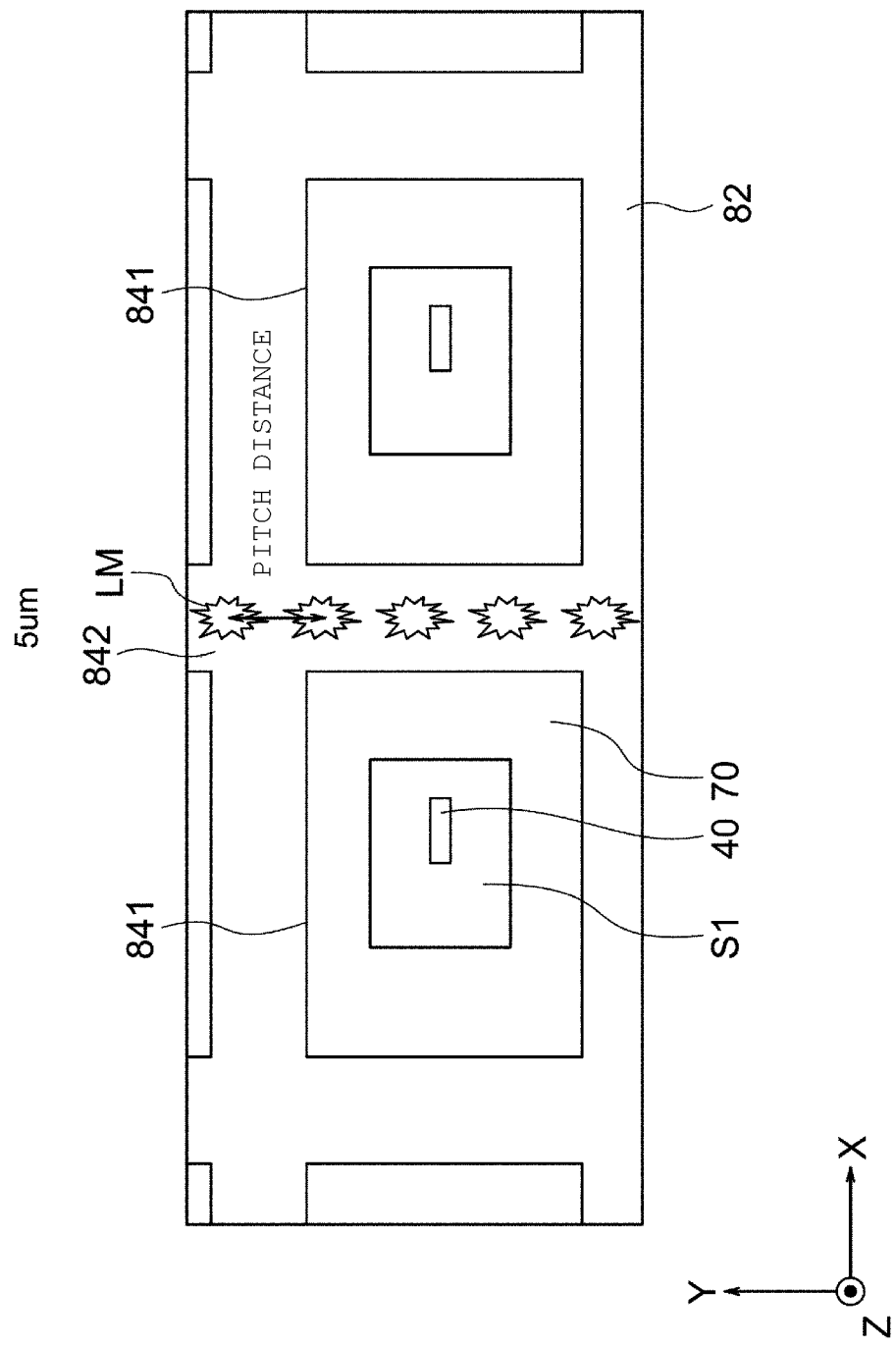
FIGS. 7A and 7B depict aspects related to irradiation pitch distance.
Figure 7B:
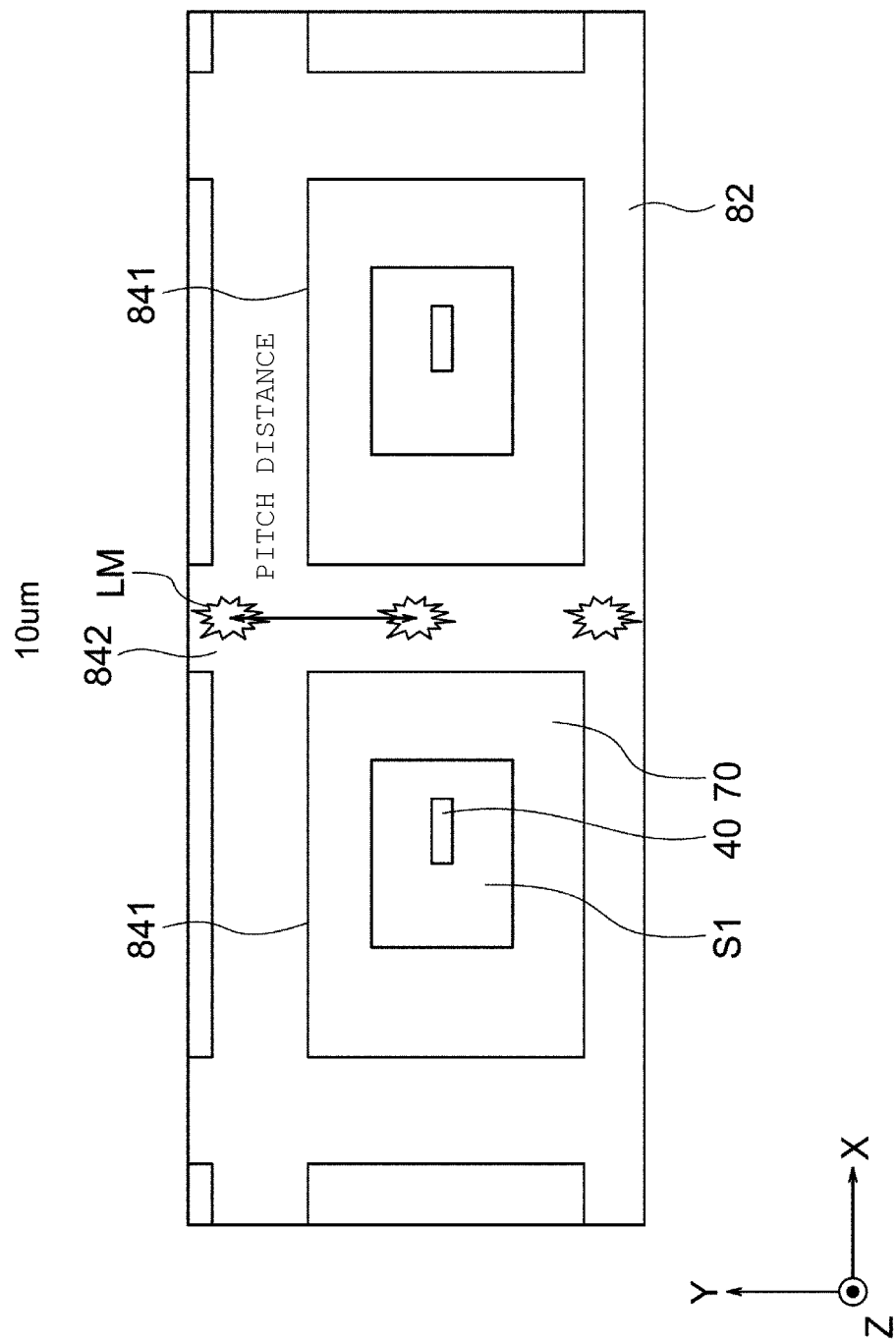

As a further example, an irradiation pitch distance of the laser beam L may be adjusted to about 5 μm and about 10 μm as illustrated in FIGS. 7A and 7B, respectively. The irradiation pitch distance is a condition based on an emitting speed of an irradiation unit Lu for emitting the laser beam L or an irradiation frequency of the laser beam L. In the example, an emitting direction of the irradiation unit Lu that is a direction of the irradiation pitch distance is a Y direction in the drawing.

In the example, the range of the irradiation pitch distance is from about 5 μm to about 10 μm. The adjustment of the irradiation pitch distance can control a density (may also be referred to as a first density or a Y direction density) of the modified portions LM to be formed within a target region in the support 82 or the protrusion portion 842. The shorter the irradiation pitch distance is, the greater the first or Y direction density of the modified portions LM becomes and the more the warpage is corrected.

FIGS. 8A and 8B are schematic views illustrating aspects related to an irradiation line interval. In the examples of FIGS. 8A and 8B, the direction of the irradiation line interval is an X direction. FIGS. 8A and 8B illustrate irradiation line intervals of one line or two lines, respectively.

In the case where the irradiation line interval is set to one line, the modified portions LM are formed for every single line of the protrusion portion 842 in the support 82 as shown in FIG. 8A. In the case where the irradiation line interval is set to two lines, the modified portions LM are formed every two lines (every other line) of the protrusion portion 842 as shown in FIG. 8B.

By changing the irradiation line interval, the density of the modified portions LM can be changed. As the irradiation line interval is decreased, the warpage can be corrected more accurately.

In the first embodiment, the division into pieces is performed by stealth dicing or the like. Therefore, it is necessary that the modified portions LM are formed on all lines of the protrusion portions 842 prior to at least the division into pieces. The process of forming the modified portions LM may be performed prior to the division into pieces. Patterns of the modified portions LM may be different between the formation of the modified portions LM for the warpage correction and the formation of the modified portions LM for division into pieces or dicing.

As illustrated in FIGS. 9A and 9B, the laser beam L may be incident on the support 82 from different surfaces, that is, the second surface F2 or the first surface F1.

As illustrated in FIG. 9B, the laser beam L may be emitted from the first surface F1 side, rather than from the second surface F2 side. If the focal points of the laser beam L in both cases of FIGS. 9A and 9B are set to be the same with each other within the same protrusion portion 842, the condition to achieve the same focal height is changed between the two cases.

In the case of a laser beam incident from the first surface F1 side (FIG. 9A), if the laser beam L is unlikely (or unable) to pass through the resin layer 70, the resin layer 70 on the first surface F1 must be removed by polishing in a similar manner to the polishing process as illustrated in FIG. 3H. If the resin layer 70 is provided so as not to overlap the protrusion portions 842, the laser beam L can be incident from the first surface F1 side without requiring the polishing/removal of the resin layer 70.

According to the first embodiment, the protrusion portions 842 are formed on the first surface F1 of the support 82, and the modified portions LM are formed in the protrusion portions 842. Such formation can control the warpage of the support 82 that has been caused because of the resin layer 70 in the support 82 (for example, due to the difference in thermal expansion coefficient between the resin layer 70 and the support 82) and prevent further warpage of the support 82. The warpage of the support 82 affects subsequent processing, such as formation of the redistribution layer 100 onto the support 82 and division of the support 82 into pieces. Precision of such processing of the support 82 can be effectively improved by correcting, reducing, or counteracting the warpage of the support 82 according to the first embodiment.

If the protrusion and recess pattern 84 (including the protrusion portions 842) is not provided to the surface F1 of the support 82, the modified portions LM must be formed inside the resin layer 70 for correction of the support warpage. However, since a laser beam L is unlikely to permeate through and be focused in the resin layer 70 due to fillers contained in the resin layer 70, it is difficult to form the modified portions LM inside the resin layer 70.

On the other hand, in the first embodiment, the protrusion and recess pattern 84 including the protrusion portions 842 is provided to the support 82 and is irradiated with the laser beam L so that the modified portions LM can be easily formed in the protrusion portions 842. The laser beam L can permeate through and be focused in the protrusion portions 842 that contain the material capable of forming the modified portions LM therein. Thus, the warpage of the support 82 can be effectively corrected.

In the first embodiment, the division into pieces can be performed by using the modified portions LM that has been formed for prevention of the warpage. Thus, the time and the number of processes for division into pieces can be reduced.

In the first embodiment, the support 82 is cut by cleaving each of the modified portions LM as a starting point. Therefore, a cutting margin (dicing width) can be reduced, and the width of each of the protrusion portions 842 can be further reduced. This achieves a greater number of packages from one single support 82. As one example, the width of each protrusion portion 842 may be 30 μm or more.

In the first embodiment, the member 80 (that is the support 82 divided into pieces) remains so as to be exposed on the surface of a package as illustrated in FIG. 1. Thus, the adhesion during shield sputtering can be enhanced.

The material for the member 80 (the support 82) is not limited to silicon (Si). For example, it may be a semiconductor material, such as silicon carbide (SiC).

In the example illustrated in FIG. 1, the columnar electrode 30 is provided to each of the semiconductor chips 10. Alternatively, the columnar electrode 30 may electrically connect the redistribution layer 100 to at least one of the semiconductor chips 10 of the stacked body S1. In the latter case, such semiconductor chips 10 are then electrically connected to the other semiconductor chips 10 which do not have the columnar electrode 30 by wire bonding. In the example, since the member 80 exists on lateral and lower sides of the stacked body S1 where there is no electrode, at least one columnar electrode 30 is provided to be connected to an electrode above the stacked body S1.

In the process of polishing the second surface F2 that is the back surface of the support 82 in FIG. 3J, the thickness of the support 82 may be reduced, and the size of the warpage of the support 82 may vary due to distortion generated by polishing and the like. Therefore, a further modified portion LM may be formed after polishing the back surface and before dividing the support 82 into pieces.

Modification

Figure 10:
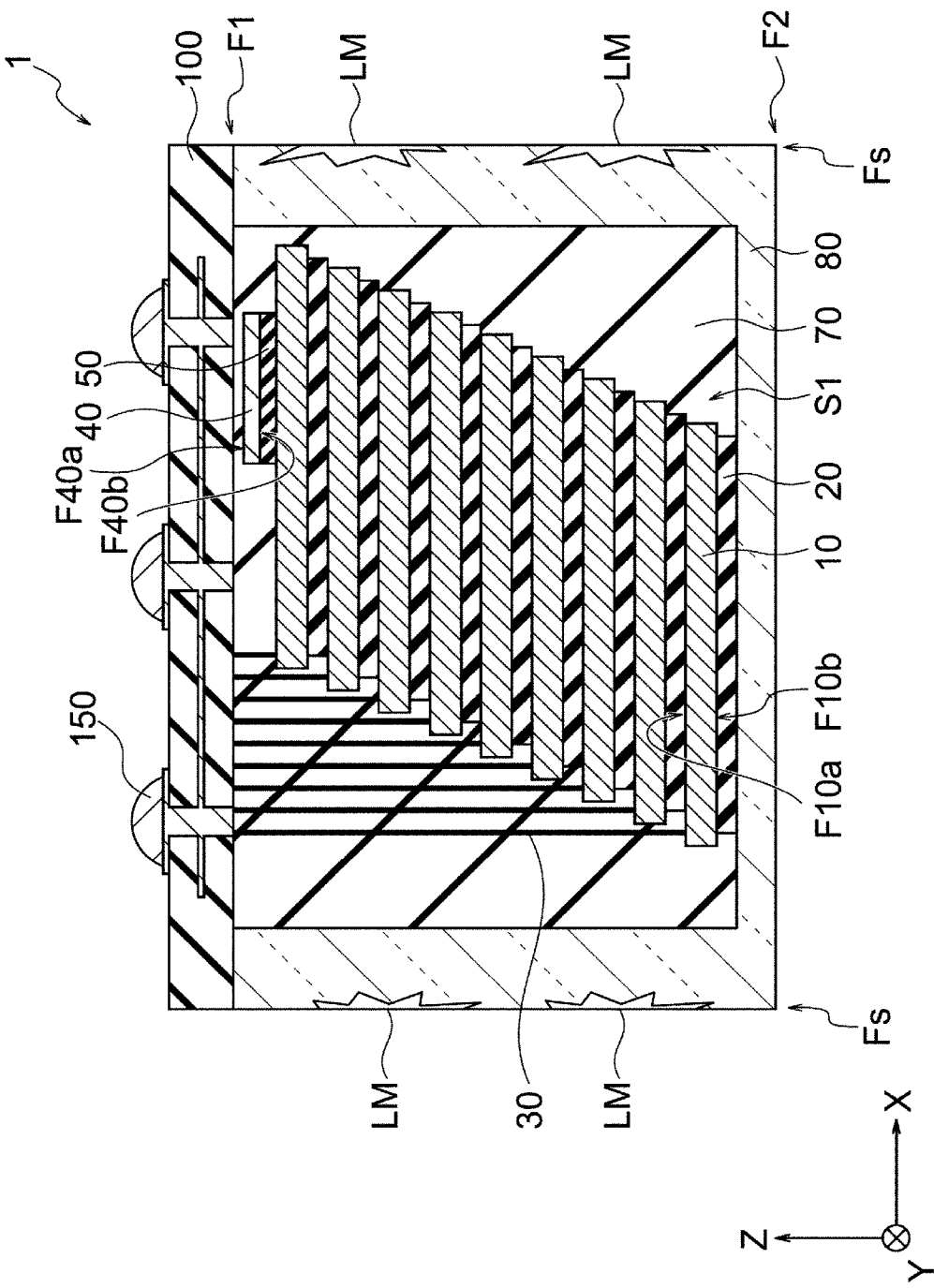
FIG. 10 depicts a semiconductor device according to a modification of a first embodiment.

In one modified embodiment as shown in FIG. 10, a material of the member 80 differs from that of the member 80 in the first embodiment.

For example, glass may be used for the material of the member 80 or that of the support 82 of the semiconductor device 1. The material of the member 80 or the support 82 is not limited so long as it has such a characteristic or a property that the modified portions LM can be formed using the laser beam L. Also, in the modified embodiment, the member 80 can improve the adhesion during shield sputtering in a similar manner to the first embodiment.

The other aspects of the semiconductor device 1 according to the modified embodiment can be the same as the semiconductor device 1 according to the first embodiment. In the semiconductor device 1 according to the modified embodiment, the same effects according to the first embodiment can be obtained.

Second Embodiment

Figure 11:
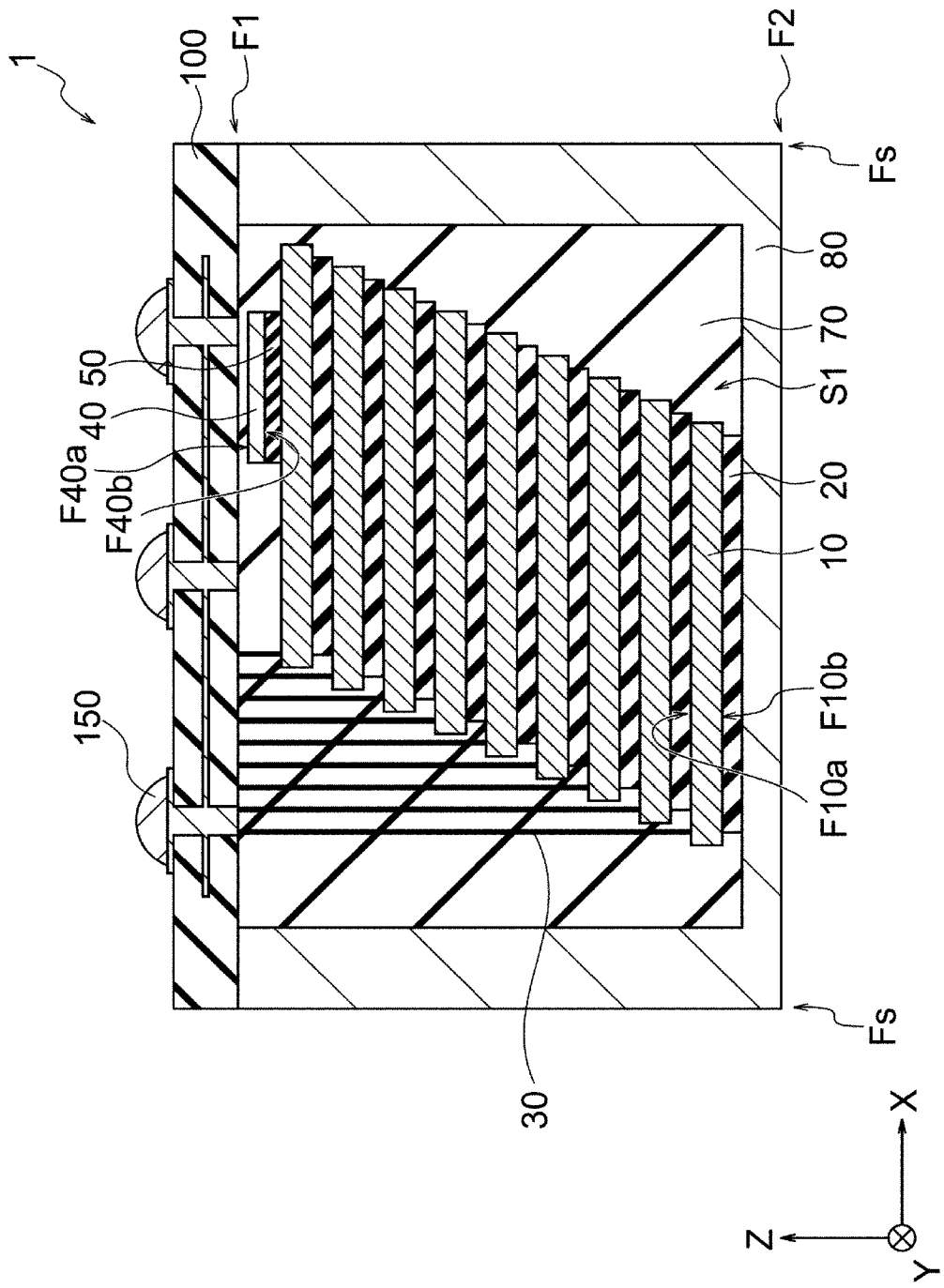
FIG. 11 depicts a semiconductor device according to a second embodiment.
Figure 12:
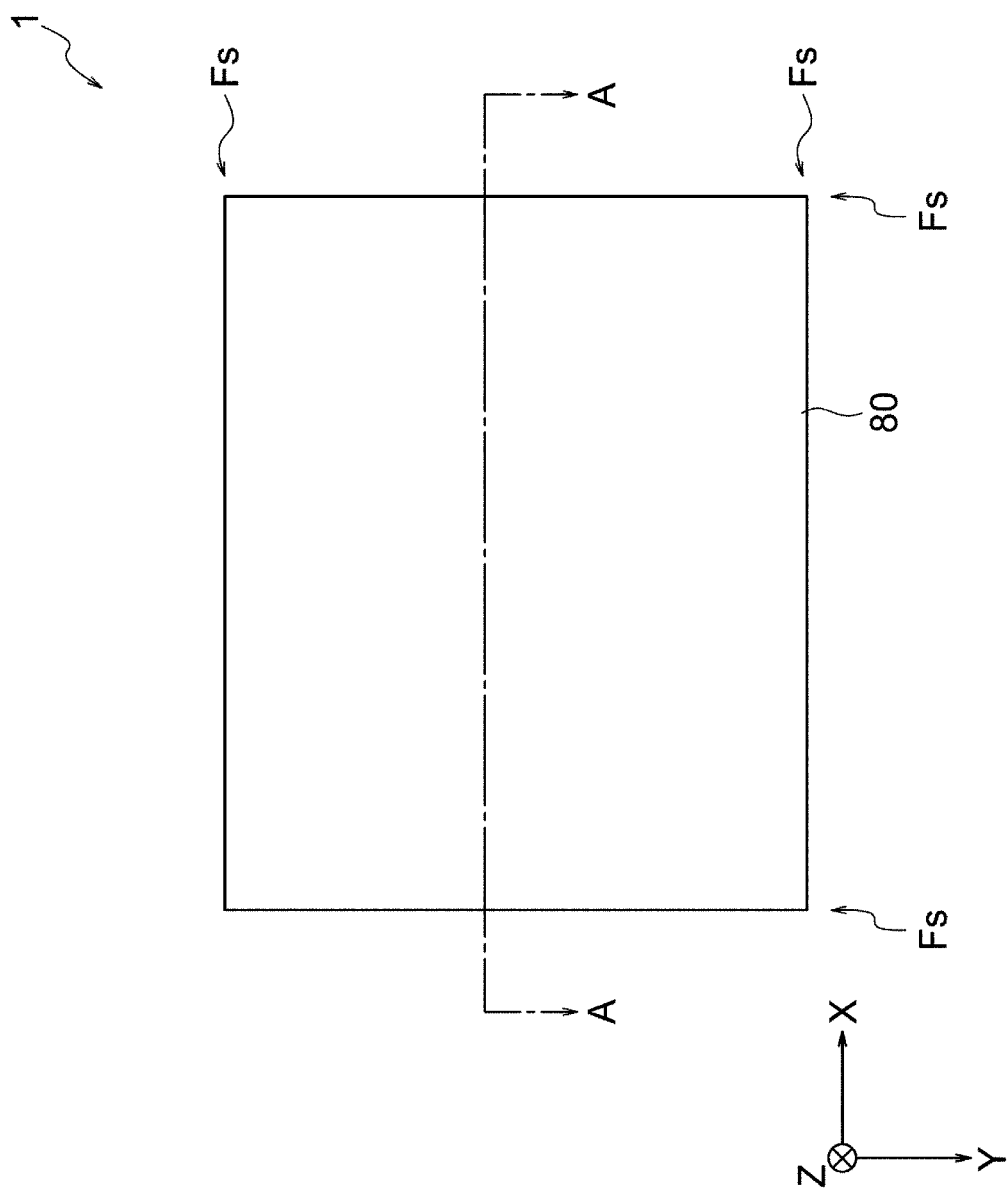
FIG. 12 depicts a bottom view of a semiconductor device according to a second embodiment.

An example of a configuration of a semiconductor device 1 according to a second embodiment is depicted in a cross-sectional view in FIG. 11 and in a bottom view in FIG. 12. Line A-A in FIG. 12 indicates the cross section of the semiconductor device 1 corresponding to FIG. 1. A method or process for dividing the member 80 or the support 82 into pieces in the second embodiment differs from that in the first embodiment.

In the second embodiment, the modified portions LM are not provided as illustrated in FIGS. 11 and 12.

The member 80 has a predetermined surface roughness at an outer peripheral portion as viewed in the stacking direction (Z direction in the drawing) of the stacked body S1. For example, the predetermined surface roughness has a maximum roughness depth RmaxD of about 0.1 μm to about 2.5 μm. The surface roughness of the side surface Fs varies depending on a condition of a blade B for cutting (see FIGS. 14A to 16B).

Figure 13:
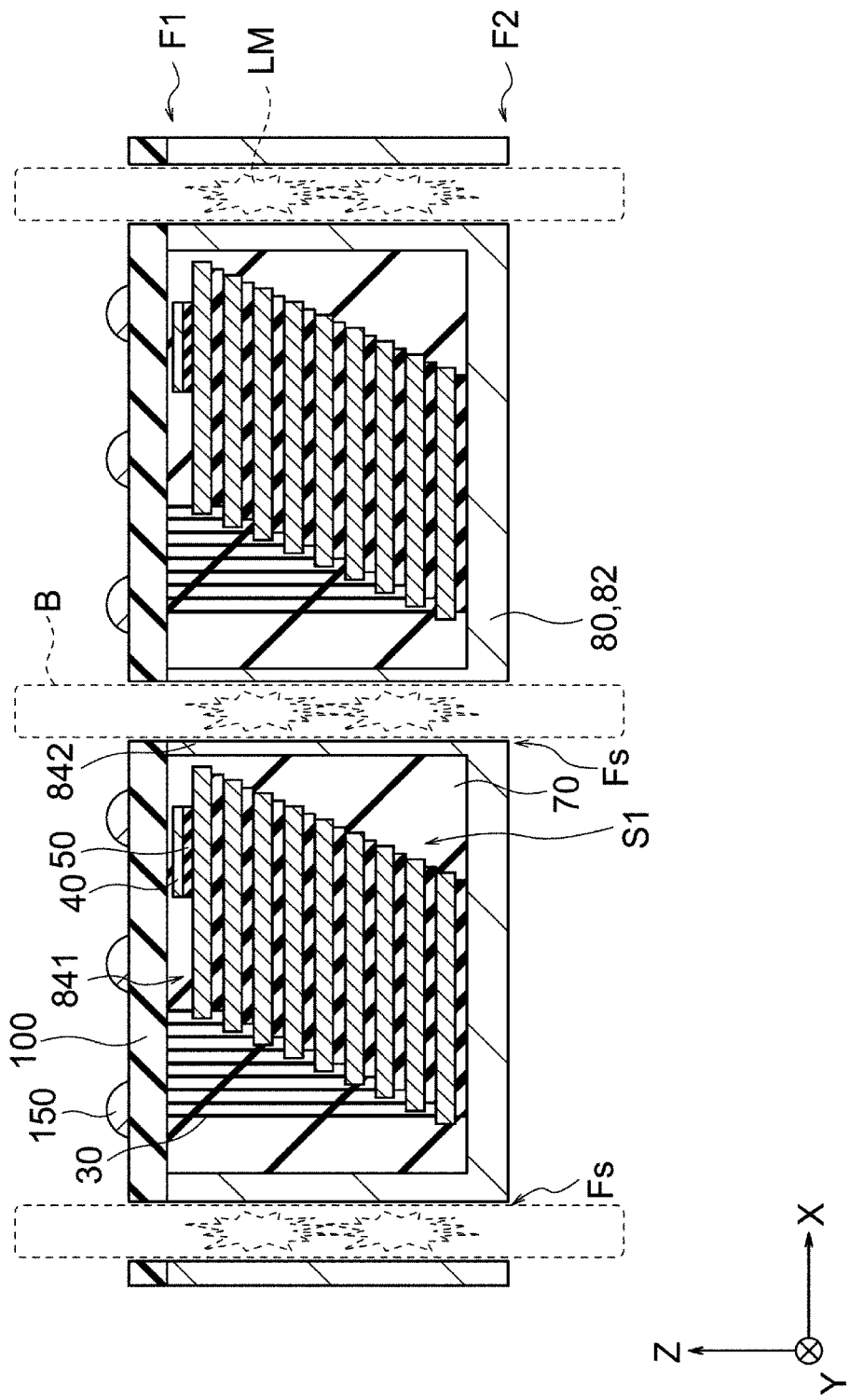
FIG. 13 depicts aspects related a method for manufacturing a semiconductor device according to a second embodiment.

An example of a method or process for manufacturing the semiconductor device 1 according to the second embodiment is depicted in a cross-sectional view in FIG. 13. The process in FIG. 13 is performed after processes that are the same as those of FIGS. 3A to 3J.

After polishing the second surface F2 (the back surface) of the support 82 (the member 80) as illustrated in FIG. 3J, the support 82 is divided into pieces with a blade B as illustrated in FIG. 13. For example, the support 82 is divided along the protrusion portions 842 into pieces by cutting the protrusion portions 842 with the blade B so that the support 82 is exposed to a cross-sectional surface after the cutting. As a result, the member 80 that is the support 82 divided into pieces remains to be exposed on the surface of a package as illustrated in FIG. 11.

In the second embodiment, since the modified portions LM are contained within a cutting margin of the blade B, the modified portions LM are removed and thus are not provided or does not remain in the member 80 after the cutting process. When the blade thickness is not sufficiently wide, the modified portions LM may partially remain at an outer peripheral portion of the member 80.

The condition of emission of the laser beam L in the second embodiment may be the same as that in the first embodiment. For instance, since the support 82 is divided into pieces using the blade B, it is not necessary to form the modified portions LM in all the lines of the protrusion portions 842 as shown in FIG. 8A where the line interval is set to one line, but rather the modified portions LM may be formed in every other one of the lines of the protrusion portions 842 as illustrated in FIG. 8B where the line interval is set to two lines.

A condition or parameter of the blade B may be adjusted also.

Figure 14A:
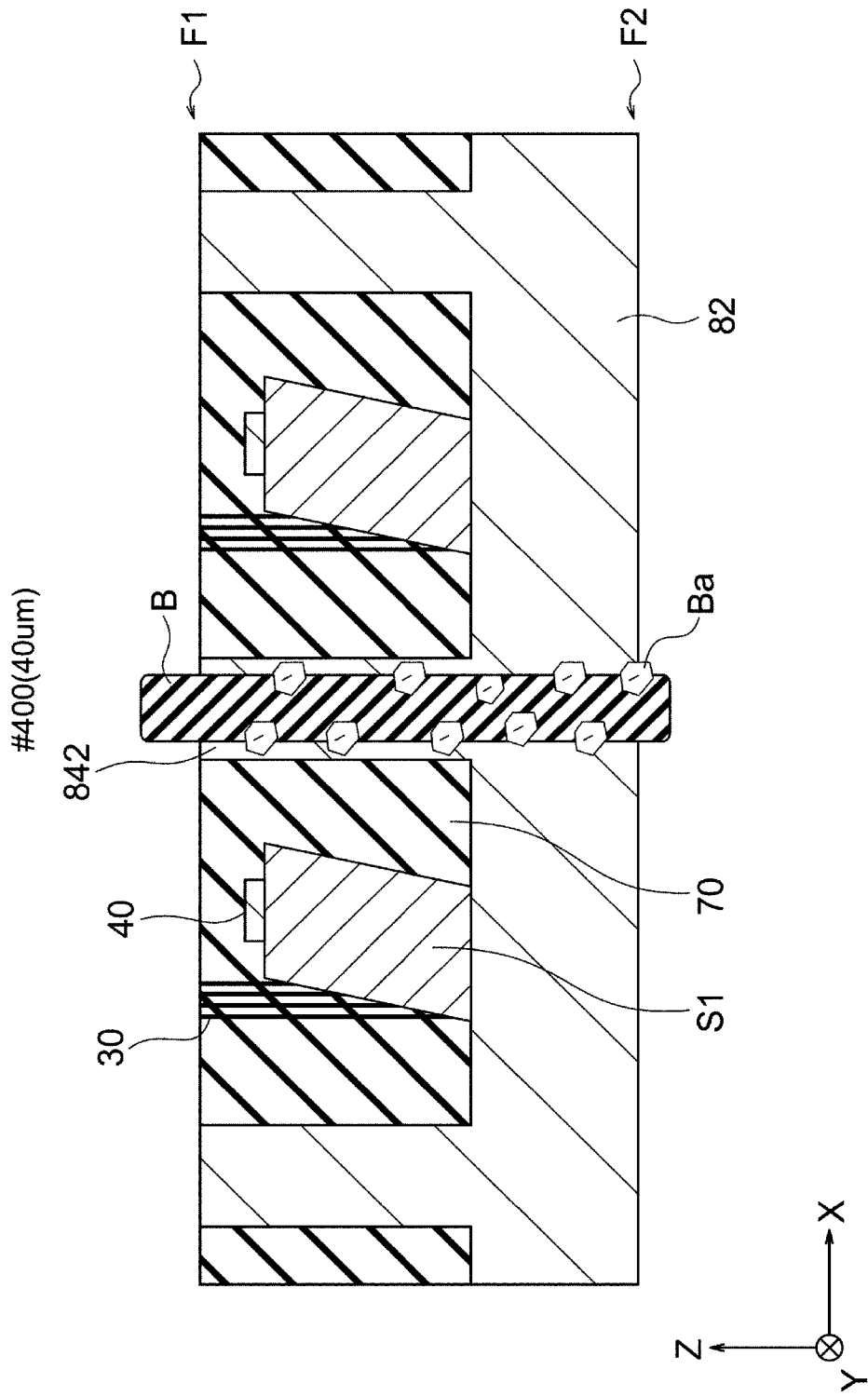
FIG. 14A depicts an example of a grain size.

FIGS. 14A and 14B are schematic views illustrating an example of different grain sizes.

As one example, a grain size of the blade B may be set to about #400 (40 µm) or about #5000 (2 µm) as illustrated in FIGS. 14A and 14B, respectively.

For example, the grain size is in a range from about #400 (40 µm) to about #5000 (2 µm). The smaller the grain size is, the greater the surface roughness of the side surface Fs of the support 82 (the member 80) becomes after the cutting process. In the example of FIG. 14A, the maximum roughness depth RmaxD of the side surface Fs resulting from the cutting process is about 2.5 µm, while in the example of FIG. 14B, the maximum roughness depth RmaxD of the side surface Fs is about 0.1 µm.

Figure 15A:
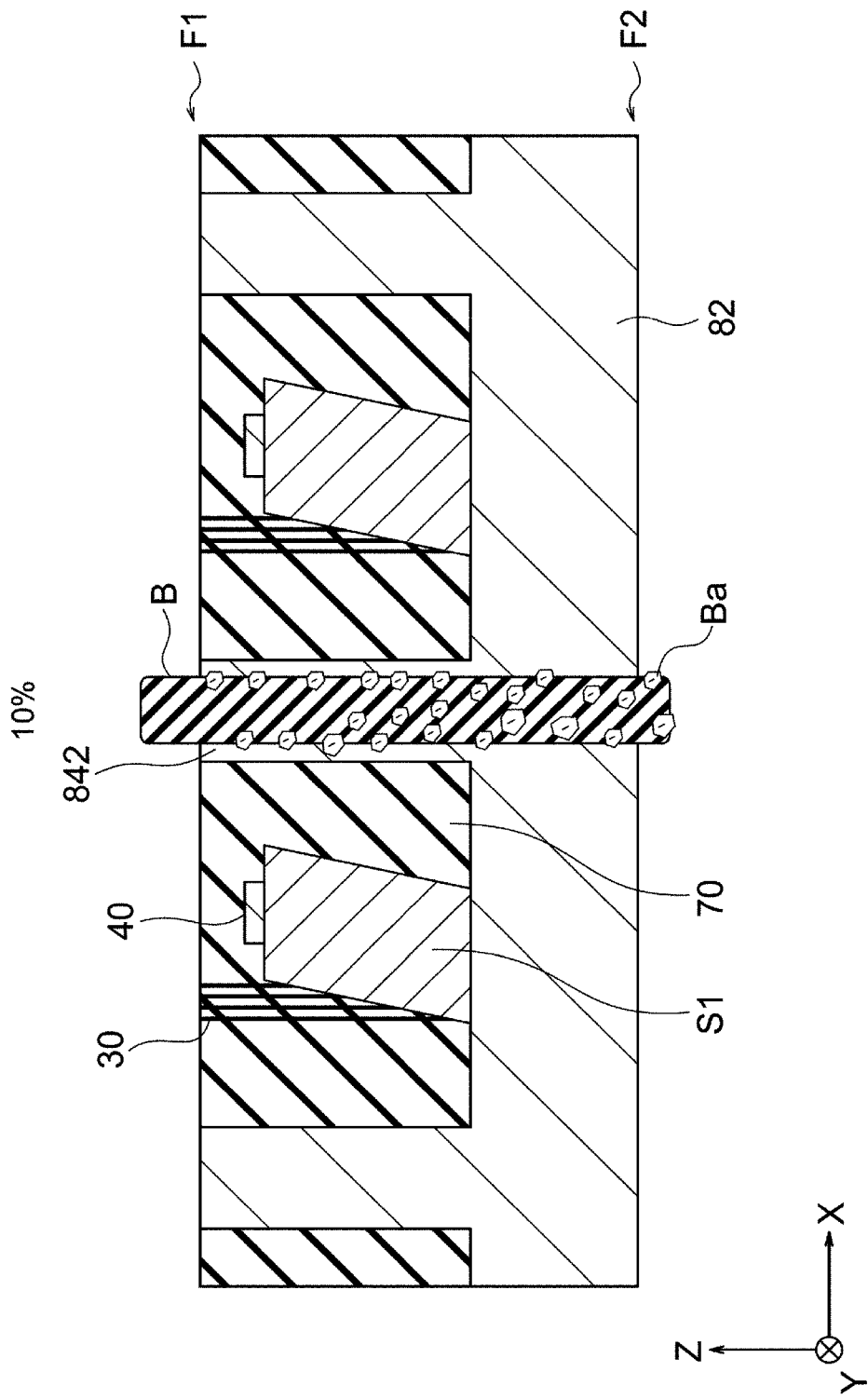
FIG. 15A depicts an example of grain concentration.
Figure 15B:
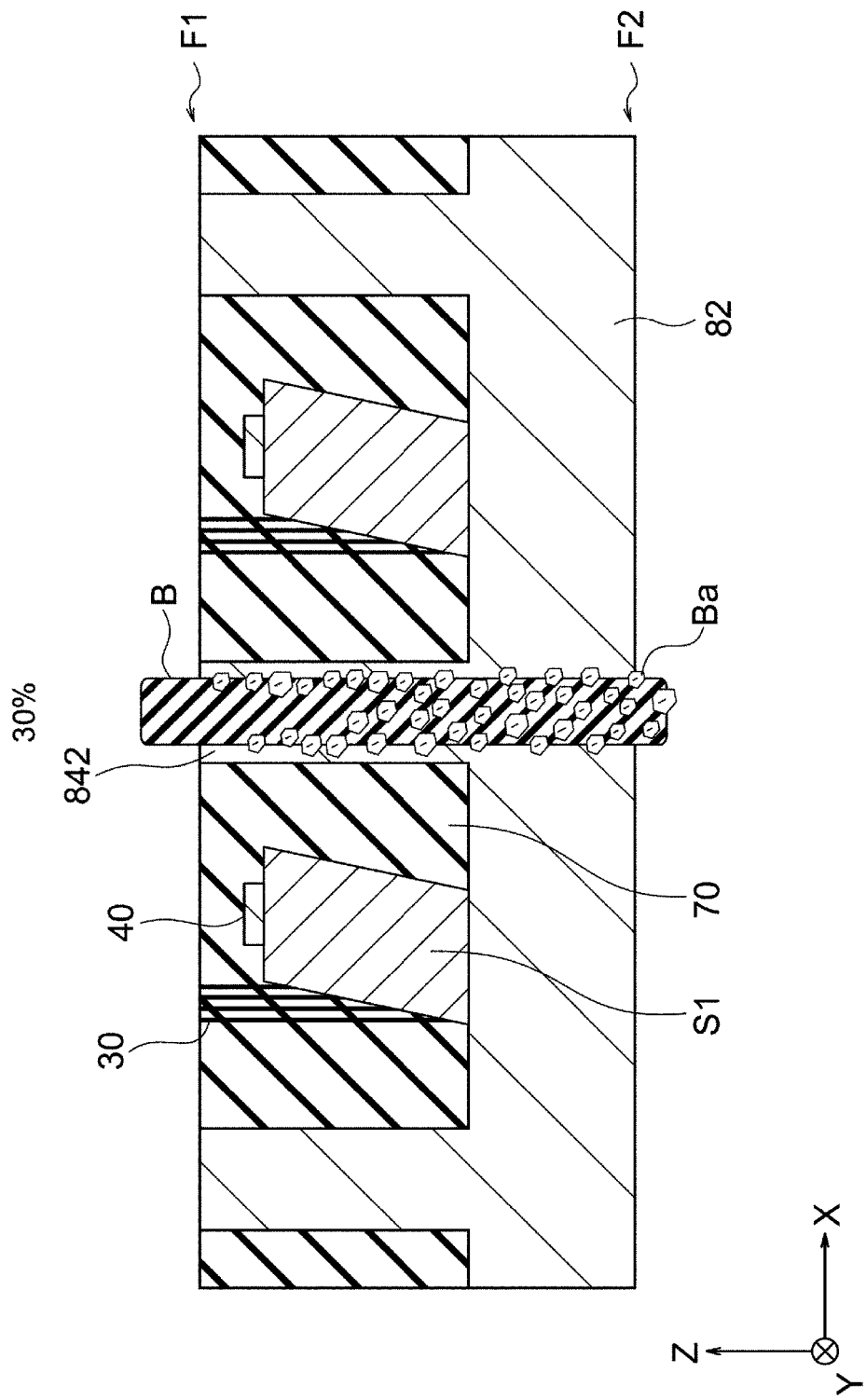
FIG. 15B depicts another example of grain concentration.

FIGS. 15A and 15B are schematic views illustrating examples of grain concentration in a blade. As another example of the blade condition, a concentration (amount) of an abrasive grain Ba may be set to about 10% or about 30% as illustrated in FIGS. 15A and 15B, respectively.

For example, the concentration may be in a range from about 10% to about 30%. The lower the concentration is, the greater the maximum roughness depth RmaxD of the side surface Fs becomes.

Figure 16A:
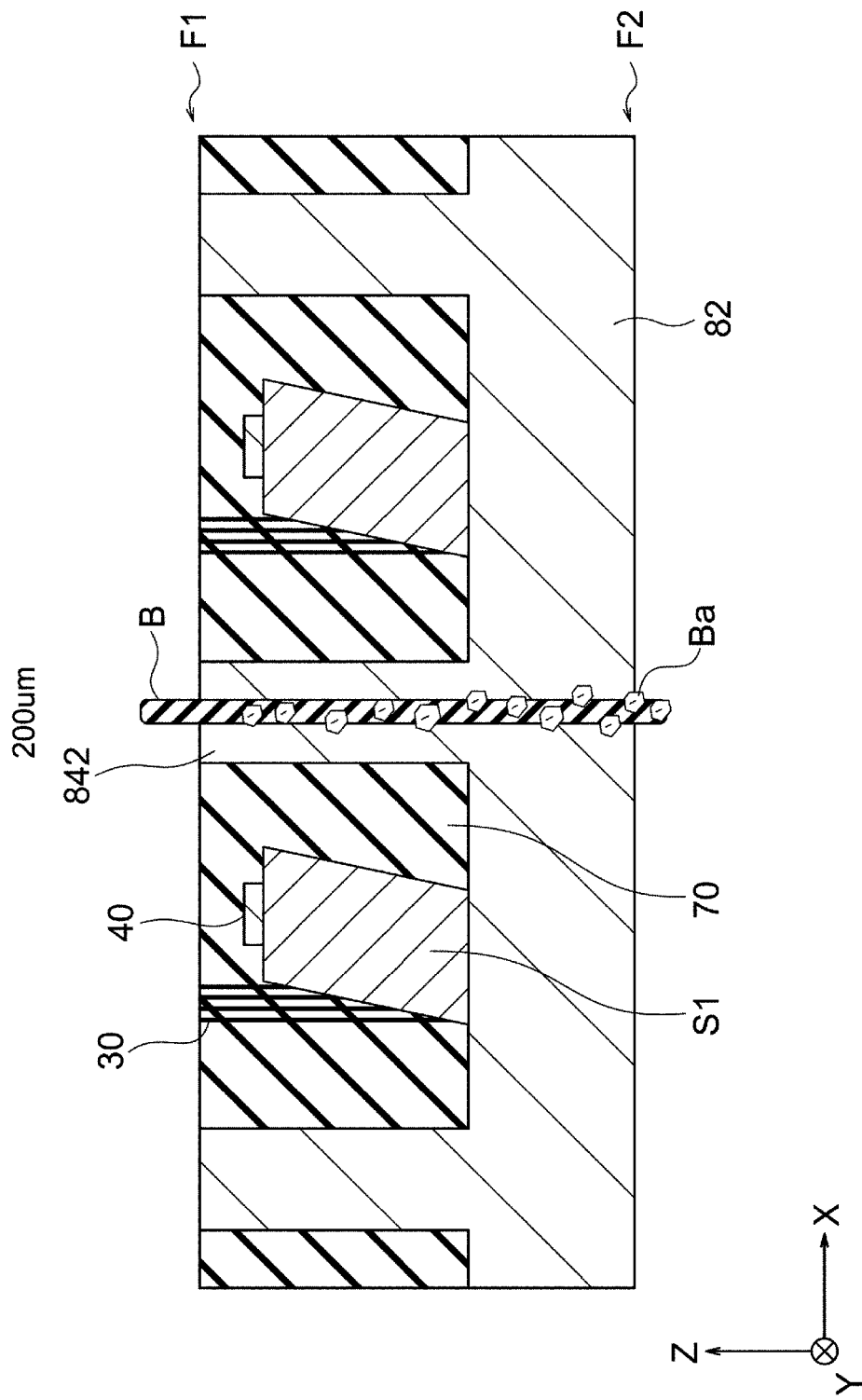
FIG. 16A depicts an example of a blade thickness.
Figure 16B:
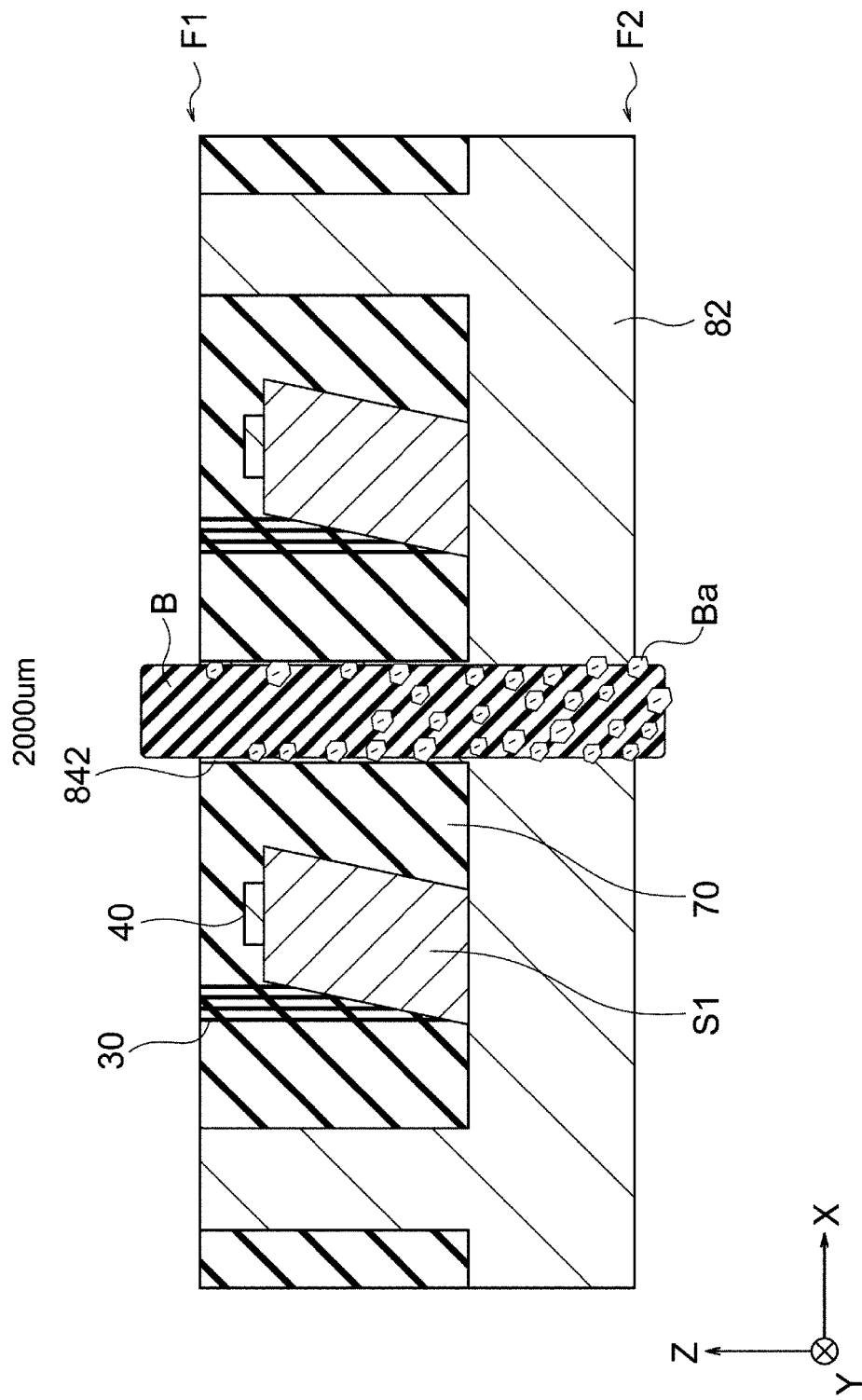
FIG. 16B depicts another example of a blade thickness.

FIGS. 16A and 16B are schematic views illustrating examples of a blade thickness. FIGS. 16A and 16B illustrate blade thicknesses of about 200 µm or about 2,000 µm, respectively.

For example, the blade thickness is in a range from about 200 µm to about 2,000 µm. The width of each of the protrusion portions 842 to be formed in the support 82 or the member 80 may be changed according to the thickness of the blade B to be used in the cutting process. For example, in a case where at least part of the member 80 is to remain on the side surface Fs after the cutting process, the width of each protrusion portion 842 needs to be greater than the blade thickness.

The other aspects of the semiconductor device 1 according to the second embodiment can be the same as the corresponding aspects of the semiconductor device 1 according to the first embodiment. In the semiconductor device 1 according to the second embodiment, the same effects as those of the first embodiment can be obtained. The second embodiment may be combined with the modification of the first embodiment.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device, the method comprising:
    forming a plurality of recess portions on a first surface of a support, a first recess portion of the plurality of recess portions being between a plurality of protrusion portions on the first surface;
    placing a stacked body into the first of the recess portion, the stacked body including a plurality of semiconductor chips;
    filling the first recess portion with a resin layer, the resin layer covering the stacked body in the first recess portion;
    irradiating a protrusion portion of the plurality of protrusion portions on the first surface of the support with a laser beam to form a modified portion in the protrusion portion;
    dividing the support along the protrusion portion into separate pieces;
    after placing the stacked body, forming a columnar electrode extending in a stacking direction of the stacked body on at least one of the semiconductor chips of the stacked body; and
    after forming the modified portion, polishing the resin layer until an end of the columnar electrode is exposed.

2. The method according to claim 1, wherein the modified portion is modified in a manner to reduce warpage of the support.

3. The method according to claim 2, further comprising:
    measuring the warpage of the support before irradiating the protrusion portion.

4. The method according to claim 2, wherein at least one of a laser output, a focal height, or a pass number of the laser beam is set so the modified portion is modified in the manner to reduce warpage of the support.

5. The method according to claim 2, wherein at least one of an irradiation interval and an irradiation direction for the laser beam is selected so the modified portion is modified in the manner to reduce warpage of the support.

6. The method according to claim 1, wherein dividing the support includes cleaving the support from the modified portion as a starting point.

7. The method according to claim 1, wherein dividing the support includes cutting the protrusion portion with a blade.

8. The method according to claim 1, further comprising:
    after forming the modified portion, polishing the resin layer until at least a surface of the protrusion portion is exposed.

9. The method according to claim 1, wherein the laser beam is incident on the protrusion portion from a second surface of the support, the second surface being opposite to the first surface.

10. The method according to claim 1, further comprising, after polishing the resin layer, irradiating the support with a laser beam to form another modified portion in at least one of the protrusion portion in the plurality of protrusion portions.

11. The method according to claim 1, wherein the forming of the plurality of recess portions on the first surface is performed by at least one of sand blasting, a blade cutting, plasma etching, reactive ion etching (RIE), or wet etching.

12. A method for manufacturing a semiconductor device, comprising:

forming a pattern of recess portions and protrusion portions in a support for semiconductor devices;

placing a stacked body in at least one of the recess portions, the stacked body comprising a plurality of stacked semiconductor chips;

forming a resin layer filling the recess portions;

irradiating at least one of the protrusion portions on the support with a laser beam to reduce a warpage of the support;

after placing the stacked body, forming a columnar electrode extending in a stacking direction of the stacked body on at least one of the semiconductor chips of the plurality of stacked semiconductor chips; and after irradiating the at least one of the protrusion portions on the support, polishing the resin layer until an end of the columnar electrode is exposed.

13. The method according to claim 12, wherein particular protrusion portions on the support are selected and at least one of a laser output, a focal height, or a pass number is set for the irradiation by the laser beam to reduce the warpage of the support.

* * * * *